(12) United States Patent
Herman et al.

(10) Patent No.: US 9,692,380 B2
(45) Date of Patent: Jun. 27, 2017

(54) DYNAMIC VOLUME ADJUSTMENT

(71) Applicant: Google Inc., Mountain View, CA (US)

(72) Inventors: Kenneth Louis Herman, San Jose, CA (US); Michael Dixon, Sunnyvale, CA (US); Bryan James, Menlo Park, CA (US)

(73) Assignee: Google Inc., Mountain View, CA (US)

( * ) Notice: Subject to any disclaimer, the term of this patent is extended or adjusted under 35 U.S.C. 154(b) by 60 days.

(21) Appl. No.: 14/681,730

(22) Filed: Apr. 8, 2015

(65) Prior Publication Data
US 2016/0301373 A1    Oct. 13, 2016

(51) Int. Cl.
| | |
|---|---|
| H03G 3/00 | (2006.01) |
| H03G 3/30 | (2006.01) |
| H04L 29/08 | (2006.01) |
| H04W 4/00 | (2009.01) |
| H04R 3/00 | (2006.01) |
| G06F 3/16 | (2006.01) |
| G07C 9/00 | (2006.01) |
| G08B 3/10 | (2006.01) |
| G08B 25/00 | (2006.01) |
| H04L 12/28 | (2006.01) |
| G08B 19/00 | (2006.01) |

(52) U.S. Cl.
CPC ........... *H03G 3/3005* (2013.01); *G06F 3/165* (2013.01); *G07C 9/00142* (2013.01); *G08B 3/10* (2013.01); *G08B 25/002* (2013.01); *H04L 12/2803* (2013.01); *H04L 67/12* (2013.01); *H04R 3/00* (2013.01); *H04W 4/008* (2013.01); *G08B 19/00* (2013.01); *H04R 2430/01* (2013.01)

(58) Field of Classification Search
CPC .. G08B 25/008; H04L 12/2803; H04L 12/282
USPC .................................................. 381/107, 104
See application file for complete search history.

(56) References Cited

U.S. PATENT DOCUMENTS

| | | | |
|---|---|---|---|
| 6,853,850 B2 | 2/2005 | Shim et al. | |
| 7,777,632 B2 | 8/2010 | Elwell | |
| 8,452,020 B2 | 5/2013 | Gregg et al. | |
| 8,848,932 B2 | 9/2014 | Poulsen et al. | |

(Continued)

OTHER PUBLICATIONS

Partial European Search Report dated Sep. 12, 2016 as received in Application No. 16164295.4.

(Continued)

*Primary Examiner* — Alexander Jamal
(74) *Attorney, Agent, or Firm* — Morris & Kamlay LLP

(57) ABSTRACT

Systems and techniques are provided for dynamic volume adjustment. A signal including a detected distance to a person may be received from a proximity sensor of a smart home environment. A volume adjustment for a speaker of the smart home environment may be generated based on the detected distance to the person and a sound level associated with the detected distance to the person. The volume of the speaker may be adjusted based on the volume adjustment. A signal from a sensor of the smart home environment indicating that the sensor has been tripped may be received. The proximity sensor may be triggered based on the received signal indicating the sensor has been tripped to detect a distance to the person to generate the detected distance. An alarm may be sounded through the speaker.

23 Claims, 12 Drawing Sheets

(56) References Cited

U.S. PATENT DOCUMENTS

| | | |
|---|---|---|
| 2005/0125088 A1 | 6/2005 | Bowden et al. |
| 2006/0082651 A1 | 4/2006 | Hirafuji et al. |
| 2007/0279219 A1* | 12/2007 | Warriner ............... G07C 11/00 340/539.23 |
| 2007/0293188 A1 | 12/2007 | Houghton et al. |
| 2009/0227232 A1* | 9/2009 | Matas ................... H04M 1/665 455/411 |
| 2010/0188219 A1* | 7/2010 | Todd ...................... G07F 19/20 340/568.1 |
| 2012/0222667 A1 | 9/2012 | Vendramini et al. |
| 2012/0314081 A1 | 12/2012 | Kleihorst et al. |
| 2013/0279706 A1 | 10/2013 | Marti |
| 2014/0085093 A1* | 3/2014 | Mittleman ............ H04L 12/282 340/628 |
| 2014/0329567 A1 | 11/2014 | Chan |
| 2014/0334644 A1 | 11/2014 | Selig et al. |
| 2014/0346241 A1 | 11/2014 | Fadell et al. |
| 2015/0163412 A1 | 6/2015 | Holley et al. |
| 2016/0301373 A1 | 10/2016 | Herman |

OTHER PUBLICATIONS

PCT/US2016/018941, International Search Report and Written Opinion issued in PCT/US2016/018941 on May 30, 2016, May 30, 2016, pp. 11.

\* cited by examiner

DYNAMIC VOLUME ADJUSTMENT

BACKGROUND

A smart home environment may include sensors that monitor various aspects of an environment such as a home. The smart home environment may include devices that include speakers. The speakers may be used to convey information to users and other occupants of the smart home environment. An alarm system of the smart home environment may use the speakers to sound an alarm, for example, when an occupant enters a home and has not disabled the alarm system. The alarm may sound until the occupant disables the alarm system, for example, by entering a PIN code. The speakers may also be used to report on hazardous conditions detected in the home or the tripping of entry way or motion sensors positioned throughout the home.

The speaker may be able to play audio at different volumes. The volume used for various types of audio, such as alarms when the home is entered and hazardous conditions, may be preset in the device, and may be adjusted by the user using a volume control. This may result in the speaker being too loud or too quiet, for example, disturbing occupants of a room unnecessarily, or being inaudible to occupants in the home when attempting to inform them of a hazardous condition.

BRIEF SUMMARY

According to an embodiment of the disclosed subject matter, a signal including a detected distance to a person may be received from a proximity sensor of a smart home environment. A volume adjustment for a speaker of the smart home environment may be generated based on the detected distance to the person and a sound level associated with the detected distance to the person. The volume of the speaker may be adjusted based on the volume adjustment.

A signal from a sensor of the smart home environment indicating that the sensor has been tripped may be received. The proximity sensor may be triggered based on the received signal indicating the sensor has been tripped to detect a distance to the person to generate the detected distance. An alarm may be sounded through the speaker.

It may be determined from the detected distance to the person that the person is at a location within a range of an authentication device of the smart home environment that would allow the person to interact with the authentication device. A volume adjustment for the speaker may be generated based on a desired sound level for a person at a location within the range of the authentication device which is lower than a desired sound level for a person at a location outside the range of the authentication device. The volume of the speaker may be adjusted based on the volume adjustment.

A signal may be received from the authentication device indicating that no interaction with the authentication device is detected. A volume adjustment for the speaker may be generated based on a sound level that is higher than a current sound level of the speaker at the location of the person. The volume of the speaker may be adjusted based on the volume adjustment. A signal from the authentication device indicating that interaction with the authentication device is detected may be received. A volume adjustment for the speaker may be generated based on a sound level that is lower than a current sound level of the speaker at the location of the person. The volume of the speaker may be adjusted based on the volume adjustment.

A signal from the authentication device indicating that a failure of an interaction with the authentication device is detected may be received. A volume adjustment for the speaker may be generated based on a sound level that is higher than a current sound level of the speaker at the location of the person. The volume of the speaker may be adjusted based on the volume adjustment.

The authentication device may be a device for receiving input from a person to disarm a security system of a smart home environment. The failure of an interaction may be detected when a person has failed to disarm a security system of a smart home environment by interacting with the authentication device. The authentication device may be a keypad. A hub computing device of the smart home environment may include the speaker and the proximity sensor. The sound level may be associated with the detected distance to the person by a monotonic function. The proximity sensor may be an active infrared sensor.

Signals from the proximity sensor including distances to objects visible to the proximity sensor in a room may be received. One of the objects may be a wall of the room. A room model for the room may be generated from the signals received from the proximity sensor. The room model may include dimensions of the room. A volume adjustment for a default volume of the speaker may be determined from the room model based on preset default volume of the speaker and the dimensions of a generic room used to determine the preset default volume of the speaker. The room model may be a 2-dimensional map of the room.

According to an embodiment of the disclosed subject matter, a means for receiving a signal including a detected distance to a person from a proximity sensor of a smart home environment, a means for generating a volume adjustment for a speaker of the smart home environment based on the detected distance to the person and a sound level associated with the detected distance to the person, a means for adjusting the volume of the speaker based on the volume adjustment, a means for receiving a signal from a sensor of the smart home environment indicating that the sensor has been tripped, a means for triggering the proximity sensor, based on the received signal indicating the sensor has been tripped, to detect a distance to the person to generate the detected distance, a means for sounding an alarm through the speaker, a means for determining from the detected distance to the person that the person is at a location within a range of an authentication device of the smart home environment that would allow the person to interact with the authentication device, a means for generating a volume adjustment for the speaker based on a desired sound level for a person at a location within the range of the authentication device which is lower than a desired sound level for a person at a location outside the range of the authentication device, a means for adjusting the volume of the speaker based on the volume adjustment, a means for receiving a signal from the authentication device indicating that no interaction with the authentication device is detected, a means for generating a volume adjustment for the speaker based on a sound level that is higher than a current sound level of the speaker at the location of the person, a means for adjusting the volume of the speaker based on the volume adjustment, a means for receiving a signal from the authentication device indicating that interaction with the authentication device is detected, a means for generating a volume adjustment for the speaker based on a sound level that is lower than a current sound level of the speaker at the location of the person, a means for adjusting the volume of the speaker based on the volume adjustment, a means for receiving a signal from the authentication device indicating that a failure of an interaction with the authentication device is detected, a means for generating a volume adjustment for the speaker based on a sound level that is higher than a current sound level of the speaker at the location of the person, a means for adjusting the volume of the speaker based on the volume adjustment, a means for receiving signals from the proximity sensor including distances to objects visible to the proximity sensor in a room, wherein at least one the objects is a wall of the room, a means for generating a room model for the room from the signals received from the proximity sensor, wherein the room model includes the dimensions of the room, and a means for determining, from the room model, a volume adjustment for a default volume of the speaker based on preset default volume of the speaker and the dimensions of a generic room used to determine the preset default volume of the speaker, are included.

Additional features, advantages, and embodiments of the disclosed subject matter may be set forth or apparent from consideration of the following detailed description, drawings, and claims. Moreover, it is to be understood that both the foregoing summary and the following detailed description are illustrative and are intended to provide further explanation without limiting the scope of the claims.

Additional features, advantages, and embodiments of the disclosed subject matter may be set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
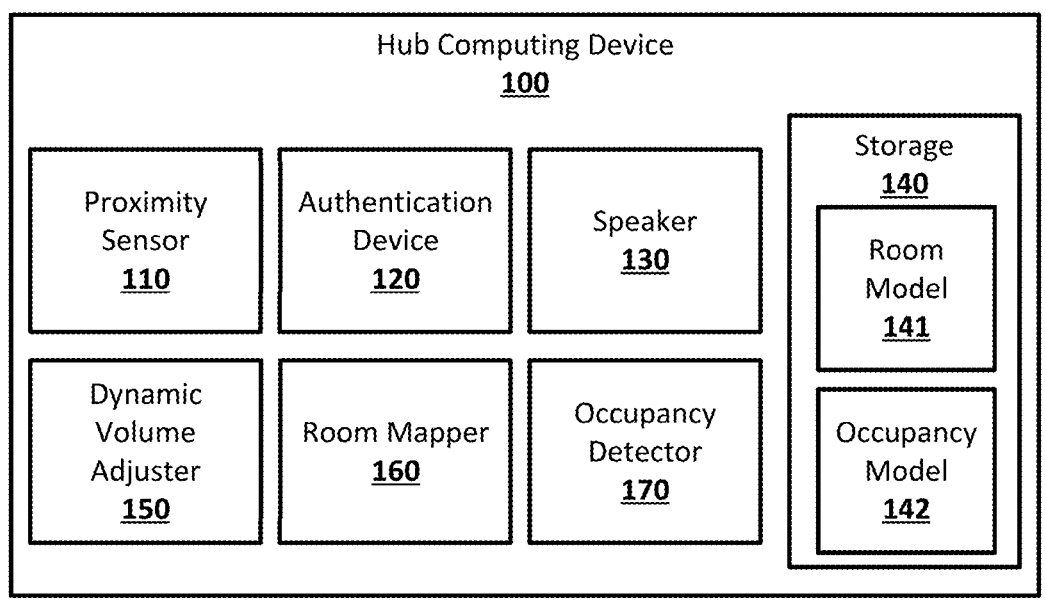
FIG. 1 shows an example system suitable for dynamic volume adjustment according to an implementation of the disclosed subject matter.

According to embodiments disclosed herein, dynamic volume adjustment may allow a speaker used within a smart home environment to have its volume adjusted dynamically to suit the context in which the speaker is operating. This may allow the volume of a speaker to be adjusted dynamically while sounding an alarm for a security system when a person has entered a home, for example, by lowering the volume as the person approaches a keypad and attempts to disarm the security system, and raising the volume if the person moves away from the keypad or stands near the keypad without resetting the alarm, or otherwise fails to disarm the security system. The volume of the speaker may also be adjusted based on the size room in which the speaker is located, for example, by raising or lowering a default volume for the speaker depending on whether the room is larger or smaller than a room that was used to originally determine the default volume. The volume of the speaker may also be adjusted based on the current occupant of a room and their positioning relative to the speaker, for example, by changing the volume so that is not too loud for the occupant nearest the speaker while not being too quiet for the occupant farthest from the speaker. The volume of the speaker may also be adjusted within the context of the smart home environment based on the presence of other speakers and occupants within the smart home environment. For example, the volume of the speaker may be increased when the speaker is sounding an alarm and the smart home environment detects that there is only one occupant within the home and the speaker is the nearest to the occupant, as the occupant is in a room that does not include its own speaker. The volume of the speaker may also be adjusted based on ambient noise level.

The environment may be, for example, a home, office, apartment, condo, or other structure, and may include a combination of enclosed and open spaces. The smart home environment may include a hub computing device, which may be any suitable computing device for managing the smart home environment, including a security system of the smart home environment and automation system including other functions beyond security. The hub computing device may be a controller for a smart home environment. The hub computing device also may be another device within the smart home environment, or may be a separate computing device dedicated to managing the smart home environment. The hub computing device may include, for example, a speaker, a keypad, and a proximity sensor such as an active infrared sensor. The hub computing device may include other suitable sensors and user interfaces, such as, for example, touchscreens, fingerprint scanners, and cameras. The hub computing device may be connected, through any suitable wired and wireless connections, to a number of sensors distributed throughout an environment. For example, the hub computing device, sensors, and other components of the smart home environment may be connected in a mesh network. Some of the sensors may, for example, be motions sensors, including passive infrared sensors used for motion detection, light sensors, cameras, microphones, entryway sensors, smart light switches, as well as mobile device scanners that may use Bluetooth, WiFi, RFID, or other wireless devices as sensors to detect the presence of devices such as smartphones, tablets, laptops, or fobs. Sensors may be distributed individually, or may be combined with other sensors in sensor devices. For example, a sensor device may include a low power motion sensor and a light sensor, or a microphone and a camera, or any other combination of available sensors.

The smart home environment may include a security system, which may include any number of modes, some of which may be armed modes. For example, when the security system may be set to an armed mode manually or automatically when all of the occupants of a house have left. When the security system is in an armed mode, a signal from a motion sensor or entryway sensor indicating that the sensor has been tripped may trigger an alarm, as the sensor tripping may indicate that an intruder is attempting to enter or has entered the house. The return of an occupant of the house may also trigger an alarm. The occupant of the house may be able to disarm the security system, turning off the alarm, by entering a PIN or other form of identification, including, for example, a typed or spoken password, gesture-based password, a voice authenticated with voice recognition, a face authenticated with facial recognition, a retinal scan, or data from a wireless device, into the hub computing device. A house may have multiple hub computing devices, each located near entryways that may be commonly used by occupants of the house. For example, a hub computing device may be located in the front hall, near the front door, and another hub computing device may located in back room, near the back door.

When an alarm is triggered, a speaker in the house may sound an audible alarm. The volume of the alarm may be loud, for example, loud enough to attract the attention of neighbors or a passerby on the street. The speaker may located on and be part of the hub computing device, or may be a separate physical component co-located with the hub computing device, such as nearby or in the same room. As the person whose entry into the house triggered the alarm approaches the hub computing device, for example, in order to use the keypad to disarm the security system, the volume of the speaker may be decreased. A proximity sensor, such as, for example, an active infrared sensor, may be used to detect the distance between the hub computing device and the person who has entered the room with the hub computing device. Each distance may be associated, for example, using a 1:1 function, look-up table, or other mapping, with a volume for the speaker, with lower volumes associated with smaller distances. The association may be absolute, or may be relative, for example, based on a default volume of the speaker and the size of the room. The closer the person is to the hub computing device, the lower the volume of the speaker, decreasing as the distance decreases. This may allow for an occupant of the home to attempt to disarm the security system without an excessively loud alarm disturbing them. If the alarm is successfully reset, for example, through entry of a proper PIN into the keypad of the hub computing device, the speaker may be silenced.

The volume of the speaker may be increased, for example, when the person moves away from the hub computing device. For example, an intruder may not realize that the alarm needs to be silenced from the hub computing device, may move towards and then away from the hub computing device, or may ignore the hub computing device, thereby moving away from it. As the distance between the person and the hub computing device increases, the volume of the speaker sounding the alarm may increase. The volume may increase up to a maximum volume, which may be, for example, maximum volume of which the speaker is capable, or some other preset maximum. The maximum volume may be reached when the person is, for example, as far away from the hub computing device as possible while still being detectable by the proximity sensor of the hub computing device.

The volume of the speaker may be decreased greatly, or temporarily silenced, when the proximity sensor detects that the person is standing close enough to the hub computing device to interact with the hub computing device. For example, the person may be close enough to touch a touchscreen or keypad on the hub computing device. The volume of the speaker may remain very low or silent while the person interacts with the hub computing device, for example, attempting to enter a PIN to disarm the security system. If the person is detected as being close enough to the hub computing device to interact with it but the hub computing device detects no interaction, the volume of the speaker may be increased again, for example, after a preset time period. For example, an intruder may approach the hub computing device, temporarily silencing it, but may then fail to attempt a PIN into the keypad, as the intruder would not know the PIN, or may not know how to interact with the hub computing device. The hub computing device may detect that though there is a person close enough to interact, no keypad keys have been pressed. Similarly, the volume of the speaker may be increased when there is a failed attempt to disarm the security system, such as the entry of an incorrect PIN into a keypad of the hub computing device. Failure to interact with the hub computing device or successfully disarm the security system may result in the speaker being raised to a volume that is greater than the volume that would be associated with the distance between the person and the hub computing device. For example, if a person standing 2 feet from the device would be normally be subject to a volume of 50 dB, failure to interact with the hub computing device or disarm the security system properly may result in the speaker being raised to a louder volume of 85 dB, as it may be assumed that the person is an intruder. The volume may also be raised over a number of failed attempts to disarm the security system, for example, with each failed attempt resulting in the speaker increasing in volume, or over the time period during which the person fails to interact with the hub computing device, with the volume increasing as more time passes without an attempt at interaction.

The modes of the security system may be armed modes or disarmed modes, or combination modes. For example, the vacation mode may be an armed mode, while the home mode may be a disarmed mode, or a combination mode. When the security system is in an armed mode, the sensors in the environment may be considered armed. Signals from an armed sensor may be checked to determine if the sensor has been tripped. For example, an armed motion sensor may be tripped when it detects motion, and an armed entryway sensor may be tripped when the monitored entryway is opened or otherwise disturbed. The tripping of an armed sensor may result in the generation of an alarm, alert, or other such notification, as the tripping may indicate the presence of an unauthorized person or other intruder in the environment. Sensors that are disarmed may not be tripped. In a combination mode, certain sensors in the environment may be armed, while other sensors may be disarmed. For example, in a home mode, sensors monitoring external entryways may be armed, while sensors monitoring internal entryways and motion may be disarmed. This may allow, for example, alarms to be generated when someone tries to enter a home, while not having alarms set off by motion within the home. The modes of the security system may also manage other controls throughout the smart home environment. For example, when the security system is set to the vacation mode, a smart thermostat may be set to a low energy mode, and smart light switches may be switched on an off to simulate the presence of occupants in the home to discourage potential intruders.

The proximity sensor of the hub computing device may also be used to adjust the volume of the speaker for audio other than a security system alarm triggered by entry into the environment. For example, a house may have a number of sensors for hazard detection connected to the hub computing device. These may include, for example, smoke detectors. When a smoke detector in the smart home environment detects smoke, an audible alarm may be sounded using speakers such as those on hub computing devices through the smart home environment. An occupant may wish to override the alarm, for example, due to the occupant knowing that the source of the smoke is not a fire. As the occupant approaches the hub computing device, the volume of the speaker may be lowered, allowing the occupant to override the alarm from the smoke detector without being disturbed by a loud alarm from the speaker on the hub computing device.

The proximity sensor on the hub computing device may be used to determine a default volume for a speaker based on the size of the room in which the speaker installed. For example, a speaker on a hub computing device may be preset to a default volume, which may be based on the size of generic room. The default volume may the volume at which it may be presumed that every occupant of the room can hear an audible alarm from the speaker, for example, alerting the occupants to a detected hazard. The actual room may be a different size than the generic room on which the default volume is based, which may cause the speaker volume to be too loud or too quiet for the room in which it installed. The proximity sensor, for example, an active infrared sensor, may be used to scan the room after hub computing device is installed, allowing the hub computing device to generate a 2D map of the room. The size of the room may be determined from the 2D map, and the default volume of the speaker may be adjusted, for example, being increased if the room is larger the generic room and decreased if the room is smaller than the generic room.

The proximity sensor on the hub computing device may be used to determine the occupancy of the room, including, for example, the locations of the occupants relative to a speaker. For example, the hub computing device may include a speaker. There may be a number of people occupying the same room as the hub computing device and the speaker. The proximity sensor of the hub computing device, for example, an active infrared sensor, may be used to determine the distance between the hub computing device and each of the room's occupants. The determined distances may then be used to adjust the volume of the speaker when playing back audio, such as, for example, an audible alarm indicating detection of a hazard, through the speaker. For example, the volume of the speaker may be adjusted so that an audible alarm is loud enough to be heard by the occupant who is the farthest from the speaker, ensuring that all occupants in the room can hear the alarm, but is quiet enough not to subject the occupant closest to the speaker to excessive noise.

The distance to and location of occupants within a room as determined by a proximity sensor may also be used for targeted audio. For example, the speaker of a hub computing device may be capable of beamforming. An alarm or other audio from the speaker may be targeted at a particular occupant of a room, based on the detected location of the occupant, using audio beamforming. Occupants may be identified in any suitable manner, including, for example, by height, facial recognition, voice recognition, or the carrying of a fob or known WiFi or Bluetooth enabled device such as a smartphone or smartwatch.

The volume of the speaker may also be adjusted within the context of the smart home environment based on the presence of other speakers and occupants within the smart home environment. For example, there may be several speakers installed at various locations throughout a smart home environment, as part of or separate from hub computing devices or other sensor devices. The smart home environment may also have several sensors, such as the proximity sensors including active and passive infrared sensors, cameras, microphones, and sensors that detect fobs, known Bluetooth devices, or known WiFi devices, which may be used to detect the presence of occupants through the smart home environment.

When an alarm is triggered, for example, for example, due to the tripping of an entryway sensor or detection of a hazard, the hub computing device may determine an appropriate volume for a speaker installed on or otherwise connected to the hub computing device based on what other speakers are present in the smart home environment and the location of any occupants detected in the smart home environment. For example, if an occupant is detected in a room that does not have a speaker installed, the hub computing device connected to the speaker nearest that room may set the speaker to an appropriate volume to allow the occupant to hear the alarm. The various hub computing devices and connected speakers may dynamically adjust their volumes in a coordinated fashion, such that every detected occupant in the environment may hear the alarm at an appropriate volume given their distance from the nearest speaker. For example, a speaker nearest an occupant may increase in volume, while a speaker not near any occupant may sound the alarm quietly or silently until an occupant moves into an area where that speaker becomes the nearest speaker for the occupant, at which point the speaker may increase to an appropriate volume.

Any adjustment of speaker volume may take into account the ambient noise level within the room in which the speaker is installed or within the room in which an occupant to whom the speaker is the nearest speaker is located. For example, if a room has a number of occupants at various distances from the speaker, the volume of the speaker may be adjusted not only based on the distances of the occupants, but on the ambient noise level of the room, so that the occupants farthest from the speaker can hear and audio, such as an alarm, from the speaker over the ambient noise in the room.

In some implementations, the identity of the person whose entry into the house triggered the alarm may be ascertained by the smart home environment. For example, the person may carry a mobile computing device, such as a smartphone, tablet, laptop, or smart watch or other wearable computing device, or a FOB, which may be associated with the identity the person. Bluetooth, WiFi, RF, or NFC communications may be used to identify the mobile computing device and identify of the person associated with the device. Cameras or microphones in the smart home environment may also allow for the hub computing device to perform facial or voice recognition to identify the person.

The volume of the speaker sounding the alarm may be different depending on whether the person whose entry into the house triggered the alarm is identified as a recognized occupant of the house, or is not recognized. For example, the association between distance to the person and the volume of the speaker may use a different function for recognized and unrecognized persons, with higher sound levels for the unrecognized person at the same distances. This may make the alarm louder for an unrecognized person than for a recognized person.

FIG. 1 shows an example system suitable for dynamic volume adjustment according to an implementation of the disclosed subject matter. A hub computing device 100 may include a proximity sensor 110, an authentication device 120, a speaker 130, a dynamic volume adjuster 150, a room mapper 160, an occupancy detector 170, and storage 140. The hub computing device 100 may be any suitable device, such as, for example, a computer 20 as described in FIG. 18, for implementing the dynamic volume adjuster 150, the room mapper 160, the occupancy detector 170, and storage 140. The hub computing device 100 may be, for example, a controller 73 as described in FIG. 16. The hub computing device 100 may be a single computing device, or may include multiple connected computing devices, and may be, for example, a smart thermostat, other smart sensor, smartphone, tablet, laptop, desktop, smart television, smart watch, or other computing device that may be able to act as a hub for a smart home environment, which may include a security system and automation functions. The smart home environment may be controlled from the hub computing device 100. The hub computing device 100 may also include a display. The proximity sensor 110 may be any suitable combination of hardware and software for detecting the proximity to the hub computing device 100 of occupants or objects in an environment. The authentication device 120 may be any suitable combination of hardware and software for implementing a device such as, for example, a keypad with physical keys, a touchscreen display, a fingerprint scanner, retinal scanner, a camera for facial recognition, a microphone for voice recognition, or a WiFi, Bluetooth, RF, or NFC device for communicating with a fob, smartphone, smartwatch, or other device, that may be used to interact with the hub computing device 100 and may receive and authentic credentials. The speaker 130 may be any suitable combination of hardware and software for implementing a speaker for the playback of audio from the hub computing device 100. The proximity sensor 110, the authentication device 120, and the speaker 130 may be built-in to the hub computing device 100, or may be separate physical components located with or near the hub computing device 100 and connected to the hub computing device 100 in any suitable manner. The dynamic volume adjuster 150 may be any suitable combination of hardware or software for adjusted the volume at which the speaker 130 reproduces audio based on signals from the proximity sensor 110, the authentication device 120, and any other sensors with signals accessible to the hub computing device 100, and based on input from the room mapper 160 and the occupancy detector 170. The room mapper 160 may be any suitable combination of hardware and software for generating a room model 141, which may be, for example, a 2D map, of a room in which the hub computing device 100 is located using, for example, signals from the proximity sensor 110. The occupancy detector 170 may be any suitable combination of hardware and software for detecting the location of occupants in a room with the hub computing device 100 based on signals from, for example, the proximity sensor 110, and detecting the location of occupants throughout an environment based on signals from a variety of sensors accessible to the hub computing device 100, generating an occupancy model 142. The room model 141 and the occupancy model 142 may be stored in the storage 140 in any suitable manner.

The hub computing device 100 may be any suitable computing device capable of acting as the hub of a smart home environment. For example, the hub computing device 100 may be a smart thermostat, which may be connected to various sensors throughout an environment as well as to various systems within the environment, such as HVAC systems, or it may be another device within the smart home environment. The smart home environment may include more than one hub computing device 100, which may work separately or in conjunction with one another to manage the smart home environment. The hub computing device 100 may include any suitable hardware and software interfaces through which a user may interact with the hub computing device 100. For example, the hub computing device 100 may include the authentication device 120, a touchscreen display, or may include web-based or app based interface that can be accessed using another computing device, such as a smartphone, tablet, or laptop. The hub computing device 100 may be located within the same environment as the smart home environment it controls, or may be located offsite. An onsite hub computing device 100 may use computation resources from other computing devices throughout the environment or connected remotely, such as, for example, as part of a cloud computing platform. The hub computing device 100 may be used to arm and disarm a security system of the smart home environment, using, for example, an interface on the hub computing device 100. The security system may be interacted with by a user in any suitable matter, including through the authentication device 120, a touch interface or voice interface separate from the authentication device 120, and through entry of a PIN, password, or pressing of an "arm" button on the hub computing device 100. The hub computing device 100 may include a proximity sensor 110, which may be used to detect the presence of and distance to people and objects around the hub computing device 100. The hub computing device 100 may also include a speaker 130, which may be used to reproduce audio to be heard in the area around the hub computing device 100.

The proximity sensor 110 may be any suitable combination of hardware and software for detecting the presence of and distance to people and objects in an area around the proximity sensor 110. For example, the proximity sensor 110 may be an active infrared sensor that may be part of the hub computing device 100, which may be installed on wall in the room of a house. The proximity sensor 110 may also be a separate physical component from the hub computing device 100, and may be connected to the hub computing device 100 in any suitable manner. The proximity sensor 110 may be able to detect, for example, using infrared light, the presence of people and objects, such as furniture and walls, in the area of the room visible to the proximity sensor 110. For example, correct installation of the hub computing device 100 may allow the proximity sensor 110 to view the entire room in which the hub computing device 100 is installed. The proximity sensor 110 may be able to distinguish between people and objects, for example, based on heat signatures determined through passive infrared radiation from the objects and people, or based on active detection including, for example, image processing of images created using an active infrared sensor. The proximity sensor 110 may also be able to determine the location of and distance to detected people and objects, or may provide data to a separate computing device, such as the hub computing device 100, which may make the location and distance determinations.

The authentication device 120 may be any suitable combination of hardware and software for implementing a device such as, for example, a keypad with physical keys, a touchscreen display, a fingerprint scanner, retinal scanner, a camera for facial recognition, a microphone for voice recognition, or a WiFi, Bluetooth, RF, or NFC device for communicating with a fob, smartphone, smartwatch, or other device, that may be used to interact with the hub computing device 100 and may receive and authentic credentials. For example, the authentication device 120 may be a keypad with an array of physical keys of any suitable type which may be positioned on a portion of the hub computing device 100 accessible to a user of the hub computing device 100. The authentication device 120 may receive input from a person, for example, the entry of PIN to disarm an armed security system in the smart home environment. The authentication device 120 may send signals to the hub computing device 100 indicating user interaction with the authentication device 120, for example, signals indicating which keys are being pressed. The hub computing device 100 may be able to infer from the signals from the authentication device 120 whether a person is attempting to interact with the authentication device 120. For example, if the hub computing device 100 receives no signals, or a low signal, from a keypad of the authentication device 120 over a period of time, indicating no keys have been pressed over that time period, the hub computing device 100 may determine that a person near the authentication device 120 is not attempting to interact with the authentication device 120. The authentication device 120 may receive any suitable credentials, including a PIN, typed or spoken password, gesture-based password, a voice authenticated with voice recognition, a face authenticated with facial recognition, a retinal scan, or data from a wireless device.

The speaker 130 may be any suitable combination of hardware and software for implementing a speaker for the playback of audio from the hub computing device 100. The speaker 130 may use any suitable speaker hardware-type with suitable capabilities, such as, for example, beamforming and audio targeting. The speaker 130 may be part of the hub computing device 100, or may be a separate physical component connected in any suitable manner to the hub computing device 100. The speaker 130 may receive audio for playback from the hub computing device 100 or from any other suitable device connected to the speaker 130, such as, for example, a separate computing device connected wirelessly to the speaker 130. The volume of the speaker 130 may be adjusted by the hub computing device 100. The speaker 130 may have any suitable frequency response and be able to handle any suitable amount of power.

The hub computing device 100 may include a dynamic volume adjuster 150. The dynamic volume adjuster 150 may be any suitable combination of hardware and software for adjusting the volume of the speaker 130 based on any suitable signals or data regarding the smart home environment. For example, the dynamic volume adjuster 150 may adjust the volume of an alarm played through the speaker 130 when an armed security system of the smart home environment has been triggered. The dynamic volume adjuster 150 be able to receive signals from the proximity sensor 110 indicating the distance of a person from the hub computing device 100, and may be able to adjust the volume of the speaker 130 based on the distance. The dynamic volume adjuster 150 may be able to receive signals from the authentication device 120 and adjust the volume of the speaker 130 based on whether or not the signals from the authentication device 120 indicate that a user is attempting to interact with the authentication device 120. The dynamic volume adjuster 150 may be able to receive signals indicating the size of the room in which the hub computing device is installed, for example, based the room model 141 generated by the proximity sensor 110, and adjust a default volume of the speaker 130 based on the size of the room. The dynamic volume adjuster 150 may be able to receive signals indicating the location of and distance to occupants of the room in which speaker 130 is installed, for example, based on the occupancy model 142, and may be able to adjust the volume of the speaker 130 so that it is not too loud for the closest occupant and not too quiet for the farthest occupant. The dynamic volume adjuster 150 may be able to receive signals indicating the location of occupants and other speakers within the smart home environment, and may adjust the volume of the speaker 130 so that occupants of the environment for whom the speaker 130 is the nearest speaker may hear an alarm from the speaker 130.

The hub computing device 100 may include a room mapper 160. The room mapper 160 may be any suitable combination of hardware and software for generating the room model 141, which may be, for example, a 2D map, of a room in which the hub computing device 100 is located using, for example, signals from the proximity sensor 110. For example, the room mapper 160 may be able to, when the hub computing device 100 is first installed in a room, scan the room using the proximity sensor 110, which may be an active infrared sensor. The proximity sensor 110 may evaluate the distance between the proximity sensor 110 and the objects in the room, including, for example, the walls, that are visible to the proximity sensor 110. The distances to the objects in the room may be used to generate the room model 141. The room model 141 may be stored in the storage 140, and may be used by the dynamic volume adjuster 150 to determine the size of the room.

The hub computing device 100 may include an occupancy detector 170. The occupancy detector 170 may be any suitable combination of hardware and software for detecting the location of occupants in a room with the hub computing device 100 based on signals from, for example, the proximity sensor 110, and detecting the location of occupants throughout an environment based on signals from a variety of sensors accessible to the hub computing device 100, generating an occupancy model 142. For example, the occupancy detector 170 may detect the occupants of the room in which the hub computing device 100 is installed using the proximity sensor 110. The occupancy detector 170 may also detect the presence of other occupants in the environment through signals received from other sensors throughout the smart home environment. The other sensors may be, for example, other proximity sensors, entryway sensors, motion sensors, cameras, microphones, and sensors that can detect the presence of a known WiFi or Bluetooth device or fob associated with an occupant of the environment, and may be located throughout the smart home environment, with signals that may be accessible to the hub computing device 100. The occupancy detector 170 may be able to generate the occupancy model 142 using signals from the other sensors. The occupancy model 142 may be stored in the storage 140, and may be used by the dynamic volume adjuster 150 to adjust the volume of the speaker 130.

The storage 140 may be any suitable storage hardware connected to the hub computing device 100, and may store the room model 141 and the occupancy model 142 in any suitable manner. For example, the storage 140 may be a component of the hub computing device, such as a flash memory module or solid state disk, or may be connected to the hub computing device 100 through any suitable wired or wireless connection. It may be a local storage, i.e., within the environment within which the hub computing device operates, or it may be partially or entirely operated by a remote service, such as a cloud-based monitoring service as described in further detail herein. The room model 141 may be model, such as 2D map, of the room in which the hub computing device 100 with the proximity sensor 110 is installed. The room model 141 may include, for example, the location of objects within the room, including the walls of the room, and their distances from the proximity sensor 110. This may allow the hub computing device 100 to determine the position of the speaker 130 relative to the rest of the room. The occupancy model 142 may be a model of the occupants of the room, or the whole environment, at a given time. The occupancy model 142 may, for example, include the locations of known and unknown persons in the environment as detected by the proximity sensor 110 and any other suitable sensors. The occupancy model 142 may be updated on a continuous basis, or when an event that makes knowing the location of occupants in the environment useful has occurred.

Figure 2:
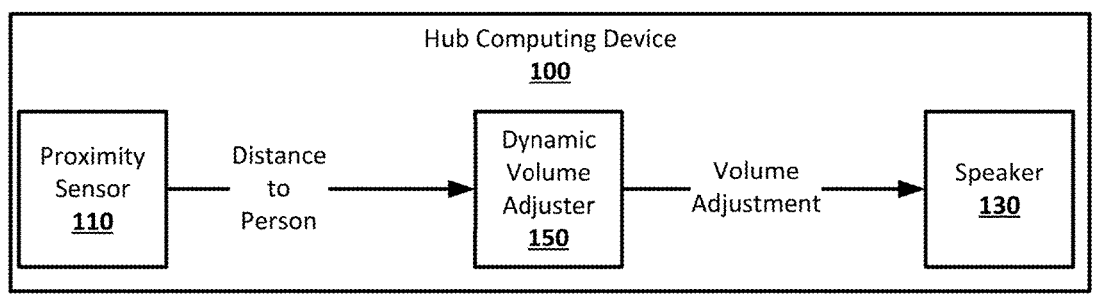
FIG. 2 shows an example arrangement suitable for dynamic volume adjustment according to an implementation of the disclosed subject matter.

FIG. 2 shows an example arrangement suitable for dynamic volume adjustment according to an implementation of the disclosed subject matter. The hub computing device 100 may be the hub, or controller, for a smart home environment which may include a security system. The security system may be set to an armed mode, which may trigger an alarm when a sensor in the environment, such as an entryway sensor on an exterior door or window is tripped. The alarm may sound through the speaker 130 of the hub computing device 100.

The proximity sensor 110 of the hub computing device 100 may detect the presence of a person in the room with the hub computing device 100. The proximity sensor 110, which may be an active infrared sensor, may determine the distance between the hub computing device 100 and the person. This may be the distance between the proximity sensor 110 and the person, if the proximity sensor 110 part of or co-located with the hub computing device 100. Otherwise, the distance to the person may be determined based on the signals from the proximity sensor 110 and the room model 141, which may include the locations of the hub computing device 100 and the proximity sensor 110.

The distance of the person from the hub computing device 100, as determined by the proximity sensor 110, may be received by the dynamic volume adjuster 150. The dynamic volume adjuster 150 may use the distance to the person to generate a volume adjustment for the speaker 130. For example, the dynamic volume adjuster 150 may lower the volume of the speaker 150 as the person gets closer to the hub computing device 100, and raise the volume of the speaker 150 as the person gets farther away from the hub computing device 100. The dynamic volume adjuster 150 may use, for example, a function that maps different distances to different volumes and may be chosen so that volume and distance increase and decrease together. The function may be continuous, for example, with a 1:1 mapping of all distances to a volume, or may be discrete, for example, mapping several discrete distance ranges to different volumes, or may be any suitable combination of discrete and continuous functions. For example, a discrete function may map a distance of 0 to 0.5 meters to a first volume level, 0.5 to 1.0 meters to a second volume level, 1.0 to 1.5 meters to a third volume level, and so on up to the farthest distance a person can be from the hub computing device 100 while still being in the same room. There may be a maximum volume level, which may be used when the person is as far away as possible while still being in the room, or is no longer detected in the room with the hub computing device. The dynamic volume adjuster 150 may also some combination of discrete and continuous functions, for example, with a volume level of 0 dB being mapped to any distance between 0 and 0.5 meters, and a continuous mapping for distances greater than 0.5 meters. This may result in the speaker 130 being silenced when a person is within a certain range of the hub computing device 100.

The volume of the speaker 130 may be adjusted dynamically. The proximity sensor 110 may continuously, or on a timed basis, check the distance to the person after the alarm is triggered and before the security is disarmed. Each determined distance may be sent to the dynamic volume adjuster 150, which may use the distance to determine an appropriate volume adjustment for the speaker 130. As a person approaches the hub computing device 100, the distances reported by the proximity sensor 110 may decrease, which may result in the dynamic volume adjuster 150 lowering the volume of the speaker 130. This may cause the alarm to become quieter. As the person recedes from the hub computing device 100, the distances reported by the proximity sensor 110 may increase, which may result in the dynamic volume adjuster 150 raising the volume of the speaker 130. This may cause the alarm to become louder.

The volume adjustment may be absolute or relative. For example, the dynamic volume adjuster 150 may set the speaker 130 to an absolute volume which may be determined by a function mapping volume to distance, or may change the volume of the speaker 130 by some amount relative to the current volume of the speaker 130.

Figure 3:
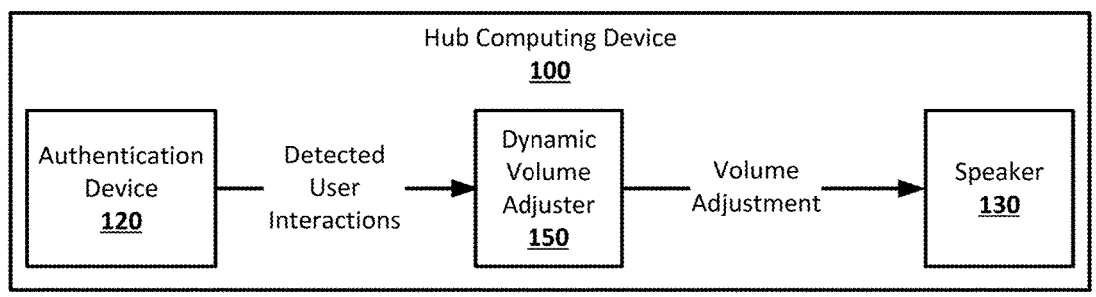
FIG. 3 shows an example arrangement suitable for dynamic volume adjustment according to an implementation of the disclosed subject matter.

FIG. 3 shows an example arrangement suitable for dynamic volume adjustment according to an implementation of the disclosed subject matter. The security system of the smart home environment may be disarmed through interaction with the hub computing device 100. This may silence a triggered alarm that may sounding through the speaker 130. For example, the security system may be disarmed through the entry of a PIN into the authentication device 120 of the hub computing device 100.

The authentication device 120 of the hub computing device 100 may detect whether a person is interacting with the authentication device 120. For example, the authentication device 120 may detect whether any of the buttons on a physical keypad have been pressed, or whether any touches have been detected on a touchscreen displaying a keypad.

The detected user interactions, or lack thereof, may be sent to the dynamic volume adjuster 150. The dynamic volume adjuster 150 may adjust the volume of the speaker 150 based on the detected user interactions. For example, the dynamic volume adjuster 150 may lower the volume of, or silence, the speaker 130 when the authentication device 120 has detected that a person is interacting with it. For example, the person may be attempting to enter a PIN to disarm to the security system and silence the alarm sounding from the speaker 130. The dynamic volume adjuster 150 may raise the volume of the speaker 130 if a person is interacting with the authentication device 120, but fails to disarm the security system. For example, the person may enter an incorrect PIN, which may result in the dynamic volume adjuster 150 increasing the volume of the speaker 130.

The dynamic volume adjuster 150 may take into account the distance between the person and the hub computing device 100, for example, as determined by the proximity sensor 110, when determining volume adjustments based on user interaction with the authentication device 120. For example. For example the proximity sensor 110 may determine that the person is standing close enough to the hub computing device 100 to interact with the authentication device 120, and the dynamic volume adjuster 150 may have lowered the volume of or silenced the speaker 130 based on this proximity. If the dynamic volume adjuster 150 receives from the authentication device 120 indicating a lack of user interaction while the proximity sensor 110 detects the person is still standing close to the hub computing device 100, the dynamic volume adjuster 150 may increase the volume of the speaker 130. The volume may increase over time, for example, getting louder the longer the person is detected to be near the hub computing device 150 without interacting with the authentication device 120, may increase by discrete amounts after elapsed periods of time without interaction, or may increase to a preset or maximum level after a single elapsed period of time without interaction. This may prevent an intruder from silencing the alarm from the speaker 130 merely by standing near the hub computing device 100. Successful entry of the PIN into the hub computing device 100 may disarm the security system of the smart home environment, silencing the speaker 130.

Figure 4:
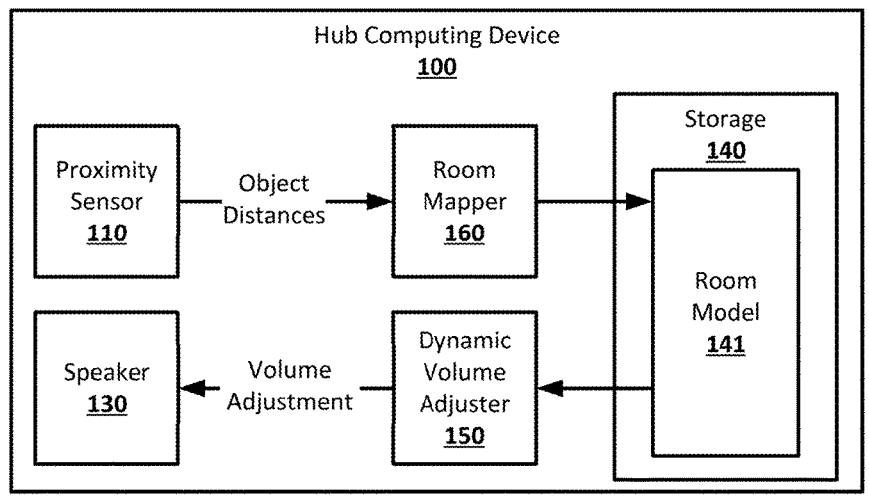
FIG. 4 shows an example arrangement suitable for dynamic volume adjustment according to an implementation of the disclosed subject matter.

FIG. 4 shows an example arrangement suitable for dynamic volume adjustment according to an implementation of the disclosed subject matter. When the hub computing device 100 is first installed in a room within a smart home environment, the hub computing device 100 may determine the size of the room. For example, the proximity sensor 110, which may be an active infrared sensor, may be used to determine the distance from the proximity sensor 110 to the various objects, including walls, within the room. The proximity sensor 110 may determine the distance to any object visible to the proximity sensor 110, and may also determine the height of objects, for example to distinguish between walls and furniture. The object distances may include the distance at which an object was detected and the vertical and horizontal angle from the proximity sensor 110 at which the object was detected. This may allow for the determination of the position of the object relative to the proximity sensor 110.

The object distances generated by the proximity sensor 110 may be received by the room mapper 160. The room mapper 160 may use the object distances to generate the room model 141, which may be, for example, a 2D map of the room. The room mapper 160 may generate the room model 141 by, for example, determining from the object distances and vertical and horizontal angles, which objects detecting by the proximity sensor 110 correspond to the walls of the room. The room model 141 may also include the location of components of the smart home environment, such as the hub computing device 100, the speaker 130, and sensors, within the room.

The dynamic volume adjuster 150 may use the room model 141 to determine the size of the room in which the hub computing device 100 is installed. The dynamic volume adjuster 150 may then generate a volume adjustment for the speaker 130, which may be part of the hub computing device 100 or located elsewhere in the room, based on the size of the room. For speaker 130 may be initially set to an initial level that is based on the size of a generic room. If the room in which the speaker 130 is located is larger than the generic room, the dynamic volume adjuster 150 may adjust the volume of the speaker 130 up. If the room in which the speaker 130 is installed is smaller than the generic room, the dynamic volume adjuster 150 may adjust the volume of the speaker 130 down. This may allow the speaker 130 to have a default volume that is appropriate for the size of the room.

Figure 5:
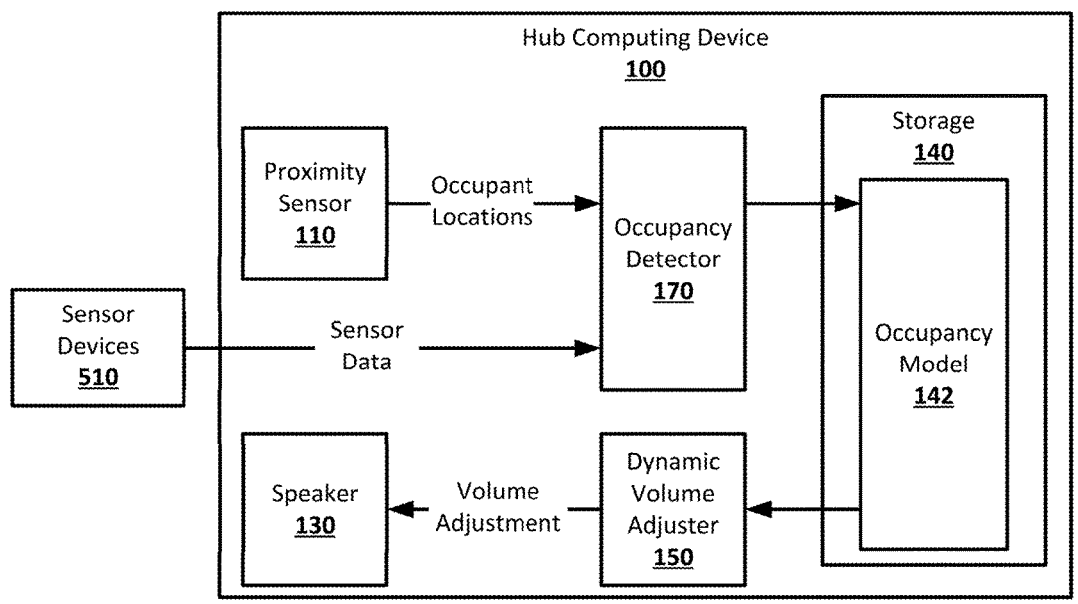
FIG. 5 shows an example arrangement suitable for dynamic volume adjustment according to an implementation of the disclosed subject matter.

FIG. 5 shows an example arrangement suitable for dynamic volume adjustment according to an implementation of the disclosed subject matter. The dynamic volume adjuster 150 may adjust the volume of the speaker 130 based on the presence and location of occupants within the same room as the speaker 130, and based on the presence and location of occupants in other rooms for whom the speaker 130 is the closest speaker in the smart home environment.

The proximity sensor 110 may detect, continuously or on a timed or event based basis, the presence of occupants within the same room as the hub computing device 100 and the speaker 130. For example, the proximity sensor 110 may determine whether the room has any occupants, and where they are located, whenever the hub computing device 100 indicates that the speaker 130 is going to be used, for example, to sound an alarm, alert, or other notification. The proximity sensor 110 may detect the presence of any occupants in the room who may be visible to the proximity sensor 110, for example, using shape recognition or infrared heat signatures to distinguish people from objects in the room. The proximity sensor 110 may determine the location within the room of each occupant, including the distance to the each detected occupant from the proximity sensor 110. The proximity sensor 110 may also determine the current height of each detected occupant. The occupant locations may be sent to the occupancy detector 170.

The occupancy detector 170 may use the occupant locations generated by the proximity sensor 110 to generate the occupancy model 142. The occupancy model 142 may include the locations of each detected occupant within the room, allowing the position of each occupant to be determined relative to the speaker 130. The occupancy model 142 may be correlated with the room model 141. The occupancy detector 170 may also receive sensor data from the sensor devices 510, which may be any other sensors in the smart home environment that may be accessible to the hub computing device 100. For example, the sensor devices 510 may be proximity sensors, including active and passive infrared sensors, entryway sensors, motion sensors, cameras, microphones, and sensors that can detect the presence of a known WiFi or Bluetooth device or fob associated with an occupant of the environment. The occupancy detector 170 may use sensor data from the sensors 510 to determine the location of occupants in the environment who are not in the same room as the hub computing device 100. The location of these occupants may be stored in the occupancy model 142 along with the location of occupants in the same room as the hub computing device 100.

The dynamic volume adjuster 150 may receive the occupancy model 142, for example, when the hub computing device 100 indicates the speaker 130 is about to be used. The dynamic volume adjuster 150 may generate a volume adjustment for the speaker 130 based on the location of occupants within the room as specified by the occupancy model 142. For example, the dynamic volume adjuster 150 may lower the volume of the speaker 130 if the current volume is too loud for the occupant of the room nearest the speaker 130 and can be lowered while still being at an acceptable volume for the occupant of the room farthest from the speaker 130. The dynamic volume adjuster 150 may raise the volume of the speaker 130 if the current volume is too quiet for the occupant of the room farthest from the speaker 130 and can be raised while still being at an acceptable volume for the occupant of the room nearest the speaker 130. This may allow an alarm sounded over the speaker 130 to be heard comfortable by all of the occupants of the room. For example, for every location in the room, there may be a target range of sound levels for a person at the location to experience in order to have the speaker 130 be neither too loud nor too quiet at the location. The dynamic volume adjuster 150 may generate the volume adjustment to optimize the number of people in the room who hear the speaker 130 at a sound level that is within the target sound range for their location without causing the speaker 130 to be extremely loud or extremely quiet for any individual person.

The dynamic volume adjuster 150 may account for the distance between the speaker and the ears of the detected occupants, for example, using the detected current heights of the occupants. The dynamic volume adjuster may account for the sound field of the speaker 130 and the angles between the speaker 130 and the occupants of the room when generating the volume adjustment. For example, a person located off to the side of the speaker 130 may experience a lower sound level at a given volume of the speaker 130 than a person located directly in-line with the speaker 130, even when both persons are the same distance from the speaker.

The dynamic volume adjuster 150 may also use the occupancy model 142, in conjunction with the location of other speakers in the smart home environment, for example, as specified in the room models 141, to determine volume adjustments for the speaker 130. For example, when an alarm is sounded, the occupancy detector 170 may generate an occupancy model 142 that may indicate that there are no occupants in the room with the hub computing device 100 and the speaker 130. The occupancy model 142 may indicate that there is an occupant in an adjoining room. The room model 141 for the adjoining room may be received by the dynamic volume adjuster 150, which may determine that there is no speaker in the adjoining room. The dynamic volume adjuster 150 may raise the volume of the speaker 130, so that the alarm may be heard by the occupant of the adjoining room that does not have its own speaker. This may allow for all occupants of the smart home environment to hear an alarm, regardless of whether they are located in a room with a speaker when the alarm is sounded.

Figure 6:
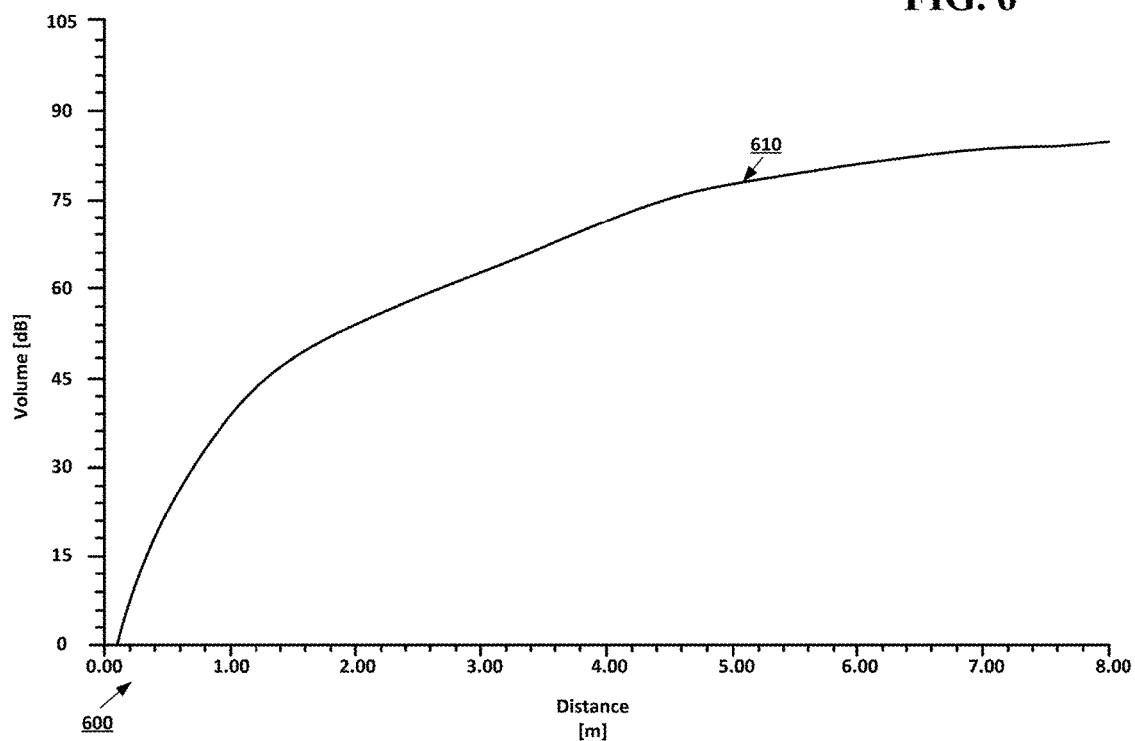
FIG. 6 shows an example graph relating distance to volume for dynamic volume adjustment according to an implementation of the disclosed subject matter.

FIG. 6 shows an example graph relating distance to volume for dynamic volume adjustment according to an implementation of the disclosed subject matter. The dynamic volume adjuster 150 may change the volume of the speaker 130 as a person approaches or recedes from the hub computing device 100 and the authentication device 120, as determined by the proximity sensor 110, when an alarm has been triggered. The dynamic volume adjuster 150 may determine an appropriate volume for a given distance to the person in any suitable manner. The graph 600 may represent a plot of decibel levels vs. distance. A point on the graph 600 may represent the sound level, in decibels, experienced by a person who is a given distance, in meters, from the speaker 130. The function plot 610 may be an example function that may be used by the dynamic volume adjuster 150 to generate volume adjustments for the speaker 130 as a person approaches or recedes from the speaker. For example, the dynamic volume adjuster may adjust the volume of the speaker 130 so that a person detected to be 5 meters from the hub computing device 100 experiences a sound level of 75 dB, while a person 3 meters from the hub computing device 100 experiences a sound level of 58 dB. The dynamic volume adjuster 150 may make the appropriate adjustments to the amplification level of the speaker 130 and associated hardware to achieve the desired decibel level at the desired distance from the speaker 130. For example, when a person is detected 3 meters from the hub computing device 100, the dynamic volume adjuster 150 may change the amplification of the speaker 130 so that the sound level 3 meters from the hub computing device 100 may be 58 dB. The dynamic volume adjuster 150 may compensate for the positioning of the speaker 130 relative to the hub computing device 100.

Figure 7:
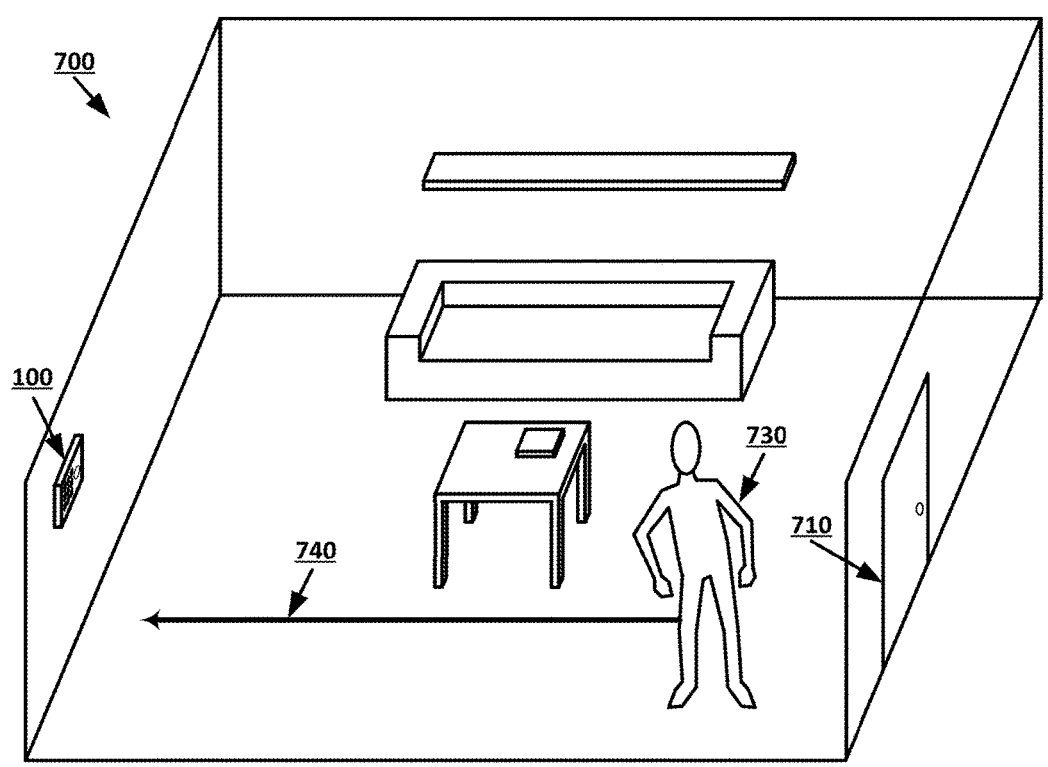
FIG. 7 shows an example environment for dynamic volume adjustment according to an implementation of the disclosed subject matter.

FIG. 7 shows an example environment for dynamic volume adjustment according to an implementation of the disclosed subject matter. The hub computing device 100, including the proximity sensor 110, the authentication device 120, and the speaker 130, may be located on a wall of the room 700. The room 700 may include an entryway 710, which may be, for example, an exterior door. When a person 730 enters the room 700 through the entryway 710, the person may trigger an alarm for the security system of the smart home environment, which may be armed. The security system may play back an alarm over the speaker 130. The person 730 may need to enter a PIN at the hub computing device 100 in order to disarm the security system and silence the alarm.

As the person moves along the path 740, towards the hub computing device 100, the proximity sensor 110 may detect the distance between the person 700 and the hub computing device 100. The detected distance to the person 700 may be used by the dynamic volume adjuster 150 to adjust the volume of the speaker 130. As the person approaches the hub computing device 100, the proximity sensor 110 may detect distances that are smaller and smaller, which may result in the dynamic volume adjuster 150 lowering the volume of the alarm played back through speaker 130. If the person 730 were to move away from the hub computing device 100, for example, back towards the entryway 710, the dynamic volume adjuster 150 may raise the volume of the speaker 130 in response to increased distances reported by the proximity sensor 110. The dynamic volume adjuster 150 may raise and lower the volume of the speaker 130 according to the function plot 610, or in any other suitable manner.

When the person 730 is close enough to the hub computing device 100 to interact with the authentication device 120, the dynamic volume adjuster 150 may lower the volume of or silence the speaker 130. If, after some time period, the person 730 does not interact with the authentication device 120, or interacts but enters an incorrect PIN and fails to disarm the security system, dynamic volume adjuster 150 may raise the volume of the speaker 130 to a level beyond the volume level that would be associated with the distance between the person 730 and the hub computing device 100. If the person 730 enters the correct PIN into the authentication device 120, the alarm may be silenced.

Figure 8:
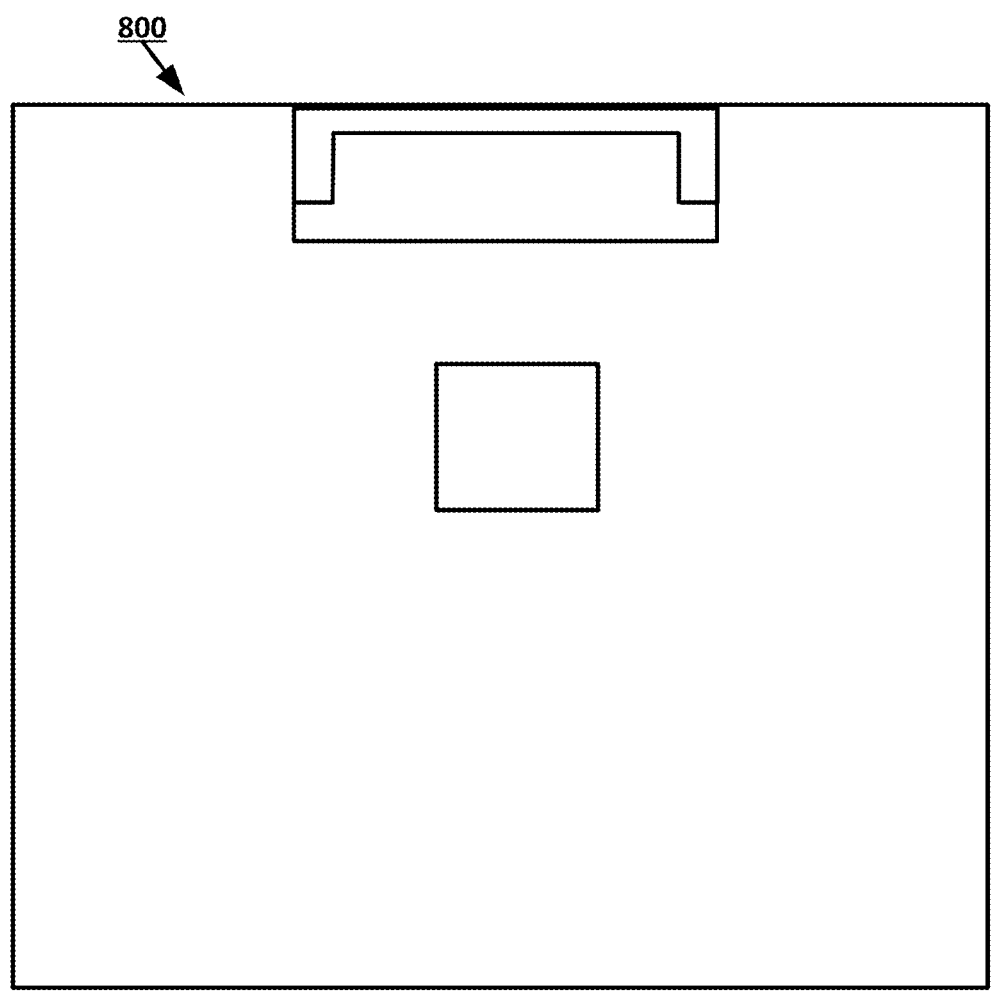
FIG. 8 shows an example 2D map of an environment for dynamic volume adjustment according to an implementation of the disclosed subject matter.

FIG. 8 shows an example 2D map of an environment for dynamic volume adjustment according to an implementation of the disclosed subject matter. The room mapper 160 may generate the room model 141 using data generated by the proximity sensor 110. For example, the proximity sensor 110 may be used to scan a room when the hub computing device 100 is first installed. The room model 141 may be, for example, 2D room map 800. The 2D room map 800 may be a 2-dimensional map of the room in which the hub computing device 100 is installed, and may include all objects detected by the proximity sensor 110 and the distances from the proximity sensor 110 to the detected objects. The 2D room map 800 may also be generated to only include walls of the room, and ignore other objects, such as, for example, couches. The 2D room map 800 may be used by the dynamic volume adjuster 150 to pick an initial or default volume for the speaker 130, for example, based on whether the room is bigger or smaller than a generic room used to set a preset volume for the speaker 130. For example, the manufacturer of the hub computing device 100 may preset the volume of the speaker 130 to a default volume at a level where an alarm may be played back loud enough to be heard at a high level in room that is 7 meters by 10 meters. The hub computing device 100, with the speaker 130, may be installed in a room that is 5 meters by 7 meters. The proximity scanner 110 may scan the room and the room mapper 160 generate the room model 141, which may be the 2D room map 800. The 2D room map 800 may include the length and width of the room, 5 meters and 7 meters, and the total area of the room, 35 square meters. The dynamic volume adjuster 150 may adjust the default volume of the speaker 130, lowering the default volume so that an alarm played back at the default volume may be loud enough to be heard in the 35 square meters room, but is less loud than the preset for the default volume, which was loud enough to be heard in a room that was 70 square meters.

Figure 9:
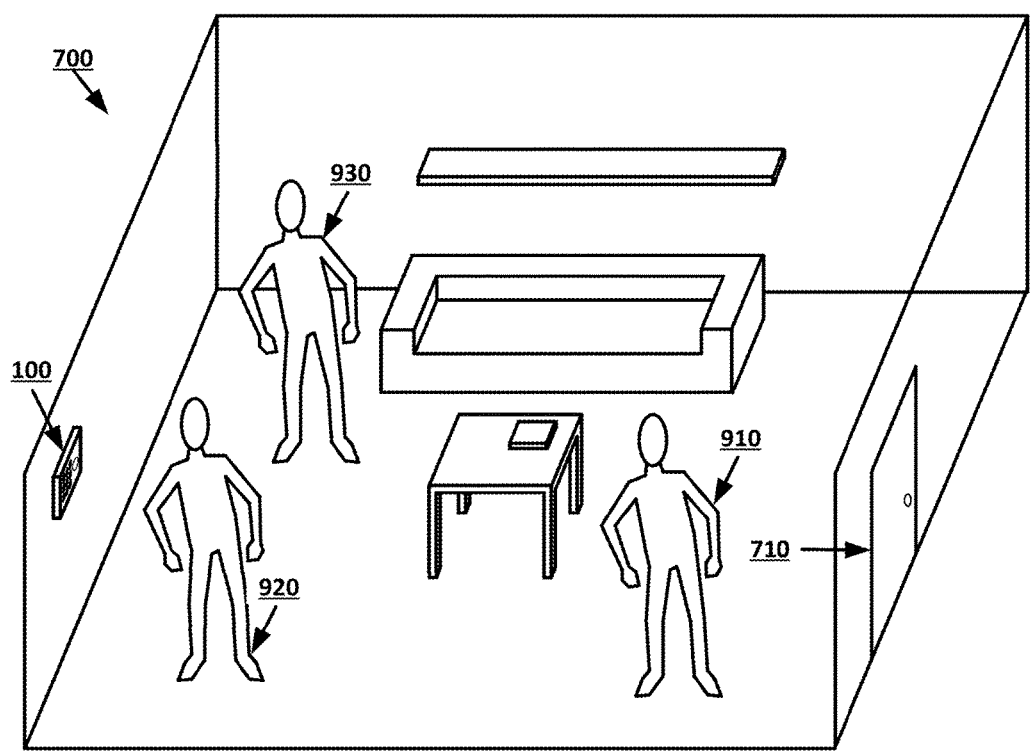
FIG. 9 shows an example environment for dynamic volume adjustment according to an implementation of the disclosed subject matter

FIG. 9 shows an example environment for dynamic volume adjustment according to an implementation of the disclosed subject matter. A room, such as the room 700, may have multiple occupants at various locations throughout the room. For example, the room 700 may include an occupant 920, located near the hub computing device 100 and the speaker 130, an occupant 910 located near the entryway 710 across the room 700 from the hub computing device 100, and the occupant 930, on the other end of the wall on which the hub computing device 100 is installed. The proximity sensor 110 of the hub computing device 100 may detect the presence and locations of the person 910, the person 920, and the person 930, within the room 700. The occupancy detector 170 may use data generated by the proximity sensor 110 to generate the occupancy model 142 for the room 700. The occupancy model 142 may include the locations of the person 910, the person 920, and the person 930 within the room 700.

The dynamic volume adjuster 150 may use the occupancy model 142 to generate a volume adjustment for the speaker 130. For example, while the person 910, the person 920, and the person 930 are in the room 700, an alarm may be triggered, for example, due to the detection of a hazard such as a fire. The alarm may sound over the speaker 130. The proximity sensor 110 and the occupancy detector 170 may generate the occupancy model 142 for the room 700, for example, triggered by the alarm. The dynamic volume adjuster 150 may receive the occupancy model 142 and may generate a volume adjustment for the speaker 130 based on the locations of the person 910, the person 920, and the person 930 relative to the speaker 130. For example, the volume of the speaker 130 may be adjusted so that the alarm may be heard by both the person 920 and the person 930 while not being too loud for the person 910. This may ensure that all of the occupants of the room 700 hear the alarm at a reasonable volume, for example, a volume that does not result in temporary or permanent hearing impairment for the person 910 while still attaining the attention of the person 920 and the person 930. For example, the dynamic volume adjuster 150 may generate a volume adjustment that may optimize the number of persons among the person 910, 920, and 930 who hear the alarm at a sound level that is within a target sound range for their location.

Figure 10:
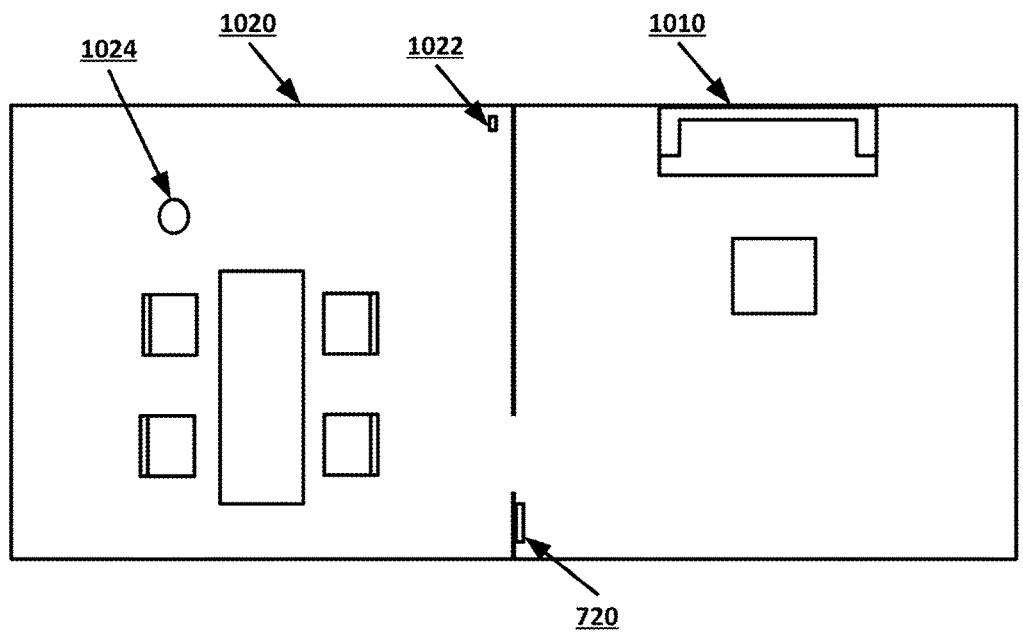
FIG. 10 shows an example environment for dynamic volume adjustment according to an implementation of the disclosed subject matter.

FIG. 10 shows an example environment for dynamic volume adjustment according to an implementation of the disclosed subject matter. A room 1010 may be adjoined to a room 1020 through an entryway, which may be open, or may include a door. The hub computing device 100, including the speaker 130, may be located in the room 1010. The room 1020 may not have any speaker located within it. A sensor 1022, which may be, for example, a motion sensor or proximity sensor, may be located in the corner of the room 1020.

When an alarm is triggered and sounded through the speaker 130, for example, to warn occupants of a detected hazard such as a fire, the proximity sensor 110 of the hub computing device 100 may be triggered to detect the presence of any persons within the room 1010. The data generated by the proximity sensor 110 may be used by the occupancy detector 170 to generate an occupancy model 142 for the room 1010, which may indicate that the room 1010 is empty. The occupancy detector 170 may also use data generated by other sensors, for example, the sensor 1022 in the room 1020, when generating the occupancy model 142, which may encompass both the room 1010 and the room 1020. For example, the sensor 1022 may detect the presence of the person 1024 in the room 1020. The occupancy detector 170 may generate the occupancy model 142 to indicate that the room 1010 is empty, and that the person 1024 is located within the room 1020. The occupancy model 142 may include the location of the person 1024 within the room 1020.

The dynamic volume adjuster 150 may use the occupancy model 142 to generate a volume adjustment for the speaker 130, for example, to ensure that all occupants of the rooms 1010 and 1020 hear the alarm. The dynamic volume adjuster 150 may determine that there is no speaker in the room 1020, and that, based on the occupancy model 142, the speaker 130 is the closest speaker to the person 1024. The dynamic volume adjuster 150 may adjust the volume of the speaker 130 so that the person 1024 may hear the alarm, even though they are not in the room 1010 with the speaker 130.

Figure 11:
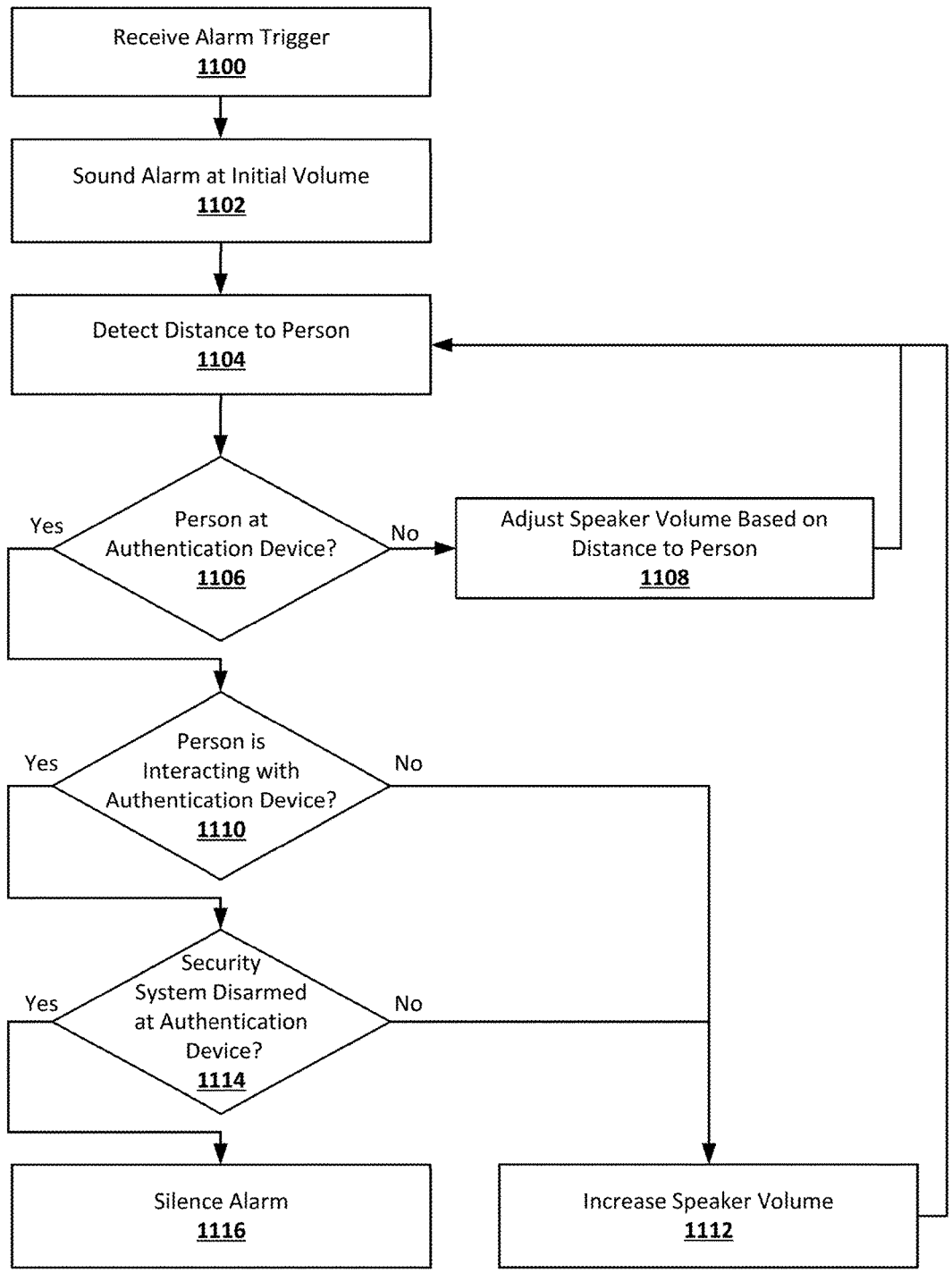
FIG. 11 shows an example of a process suitable for dynamic volume adjustment according to an implementation of the disclosed subject matter.

FIG. 11 shows an example of a process suitable for dynamic volume adjustment according to an implementation of the disclosed subject matter. At 1100, an alarm trigger may be received. For example, an entryway to a home may be opened, tripping an entryway sensor for an armed security system for a smart home environment. This may tripping of the entryway sensor may be detected by, for example, the hub computing device 100 or other computing device in the smart home environment, triggering the security system to sound an alarm.

At 1102, the alarm may be sounded at an initial volume. For example, the alarm, which may be any suitable sound, may be sounded over the speaker 130 at some initial or default volume. The initial volume may be, for example, a volume considered appropriate for attracting the attention of neighbors or passerby or bothering intruders. The initial volume may have been set based on the size of the room in which the speaker 103 is located.

At 1104, the distance to a person may be detected. The alarm may have been triggered by the opening of an entryway, which may indicate the presence of a person. The proximity sensor 110 may detect the distance to the person, who may now be in the room with the hub computing device 100 and the proximity sensor 110, having entered through the entryway. The proximity sensor 110 may use, for example, active or passive infrared, or any other suitable range detection, to determine the distance between the proximity sensor 110 and the person.

At 1106, it may be determined whether the person is at the authentication device. For example, the person may have approached the authentication device 120, which may be, for example, a keypad on the hub computing device 100. If the person is close enough to the authentication device 120 to interact with it, flow may proceed 1110. Otherwise, flow proceeds to 1108.

At 1108, the speaker volume may be adjusted based on the distance to the person. For example, the dynamic volume adjuster 150 may receive the distance to the person from the proximity sensor 110. The dynamic volume adjuster 150 may use the distance to generate a volume adjustment for the speaker 130, so that the person experiences the alarm at a desired decibel level given their distance from the authentication device 120. For example, the dynamic volume adjuster 150 may lower the volume of the speaker 130 when the person is closer, and raise the volume when the person is farther. Various distances may be associated with volumes for the speaker 130 in any suitable manner, including, for example, based on the function plot 610. The dynamic volume adjuster 150 may adjust the power received by the amplifier for the speaker 130 by an appropriate amount to achieve a desired decibel level at a desired distance from the speaker 130. After generating the volume adjustment and adjusting the volume of the speaker 130, flow may proceed back 1104, where the distance to the person may again be detected to account for any movement of the person.

At 1110, it may be determined whether the person is interaction with the authentication device. For example, the authentication device 120 may require that a person enter certain credentials in order to disarm the security system and silence the alarm, and may detect whether the person is attempting to enter those credentials. For example, the authentication device 120 may include a physical keypad, and may determine whether any of the keys have been pressed, or may be a touchscreen, and may determine if there has been any touch input into the touchscreen. If the authentication device 120 determines that the person has not attempted to interact with the authentication device 120, flow proceeds 1112. Otherwise, if some form of interaction with the authentication device 120*m* flow proceeds to 1114.

At 1112, the speaker volume may be increased. For example, the proximity sensor 110 may have detected a person close enough to the authentication device 120 to interact with the authentication device 120, but the authentication device 120 may determine that the person has not attempted any interaction, or has failed to enter proper credentials to disarm the security system. This may indicate that the person does not have the proper credentials to enter into the authentication device 120 to disarm the security system, for example, does not know the PIN code to enter into a keypad. The dynamic volume adjuster 150 may raise the volume of the speaker 130, as the person may be an intruder. Flow may proceed back to 1104, where the distance to the person may again be detected. When the person initially enters the proximity of the authentication device 120, the volume of the speaker 130 may be very low due to the closeness of the person as detected by the proximity sensor 110. If flow then comes back to 1112, the volume of the speaker 130 may be raised again, as the alarm may be sounded louder and louder the longer the person is in proximity to the authentication device 120 without interacting with it or successfully disarming the security system.

At 1114, it may be determined whether the security system has been disarmed at the authentication device. For example, the person may attempt to enter credentials, such as a PIN, password, fingerprint, voice print, or other data suitable for authentication, into the authentication device 120 to disarm the security system. If the person enters credentials that can be verified, for example, the correct PIN, flow may proceed 1116. Otherwise, if the person fails to enter correct credentials to disarm the security system, flow may proceed to 1112.

At 1116, the alarm may be silenced. For example, the person may successfully entered credentials, such as a PIN code, in to the authentication device 120. This may result in the hub computing device 100 disarming the security system. The alarm sounding over the speaker 130 may be silenced, for example, through cessation of playback. The speaker 130 may not have its volume level changed by the dynamic volume adjuster 150, or may revert to a default or initial volume level.

Figure 12:
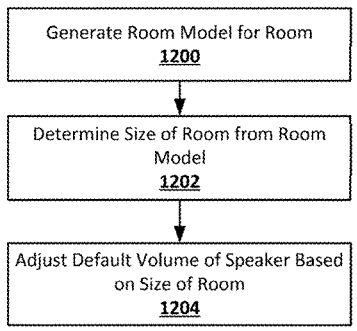
FIG. 12 shows an example of a process suitable for dynamic volume adjustment according to an implementation of the disclosed subject matter.

FIG. 12 shows an example of a process suitable for dynamic volume adjustment according to an implementation of the disclosed subject matter. At 1200, a room model for a room may be generated. For example, the hub computing device 100, including the proximity sensor 110 and the speaker 130, may be initially installed within a room. The proximity sensor 110 may scan the room, detecting the distances between the proximity sensor 110 and objects within the room, including the walls, visible to the proximity sensor 110. The distances to objects detected by the proximity sensor 110 may be received by the room mapper 160, which may generate the room model 141 for the room. The room model 141 may be, for example, a 2D map of the room, such as the 2D room map 800, and may include the dimensions of the room.

At 1202, the size of the room may be determined from the room model. For example, the dynamic volume adjuster 150 may determine the size of the room in which the hub computing device 100 is installed based on the room model 141. The room model 141 may indicate the dimensions of the walls of the room, as well as the shape of the room. For example, the room may be a rectangle with walls of 5 meters and 7 meters, from which the dynamic volume adjuster 150 may determine that the room is 35 square meters. The dynamic volume adjuster 150 may determine room size taking into account the shape of the room.

At 1204, the default volume of a speaker may be adjusted based on the room size. For example, the dynamic volume adjuster 150 may adjust the default volume for the speaker 130 based on the size of the room. The speaker 130 may be present, for example, by the manufacturer, with a default volume that may be used, for example, for hazard alarms. The present for the default volume may be based on the size of a generic room. The dynamic volume adjuster 150 may raise the default volume of the speaker 130 from the preset if the room is bigger than the generic room, and lower the default volume if the room is smaller than the generic room. This may result in alarms from the speaker 130 being heard throughout the room in which the hub computing device 100 at an acceptable level to any potential occupants of the room when played back at the default level.

Figure 13:
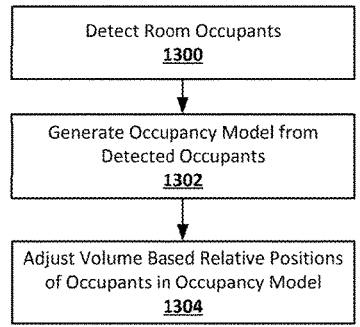
FIG. 13 shows an example of a process suitable for dynamic volume adjustment according to an implementation of the disclosed subject matter.

FIG. 13 shows an example of a process suitable for dynamic volume adjustment according to an implementation of the disclosed subject matter. At 1300, the occupants of a room may be detected. For example, an alarm, such as a hazard alarm, may have been triggered. This may trigger the proximity sensor 110 to scan a room, such as the room 700, and detect the distance occupants of the room, such as the persons 910, 920, and 930. The proximity sensor 110 may be, for example, an active infrared sensor, and may determine the presence of and distance to any occupants in the room.

At 1302, an occupancy model may be generated from the detected occupants. For example, the occupancy detector 170 may receive data from the proximity sensor 110 regarding occupants detected in the room and their distances and angles relative to the proximity sensor 110. The occupancy detector 170 may generate an occupancy model 142 for the room, which may locate the occupants of the room within the room.

At 1304, the volume of the speaker may be adjusted based on the relative positions of the occupants in the occupancy model. For example, the dynamic volume adjuster 150 may use the locations of the occupants as specified in the occupancy model 142 to determine the distance between each of the occupants and the speaker 130. The dynamic volume adjuster 150 may adjust the volume of the speaker 130 so that the alarm may be heard at an acceptable level by all of the occupants of the room. For example, in the room 700, the speaker 130 may be adjusted to a volume that is not too loud for the person 920, but still loud enough to be heard by the person 910 and the person 930. The dynamic volume adjuster 150 may have, for example, a range of acceptable sound levels, or decibel levels, that can be experienced by a person at a given distance from the speaker 130 or at a given location in the room, and may adjust the volume of the speaker 130 in order to optimize the number of occupants of the room who experience sound at a decibel within the acceptable range given their distance from the speaker 130, while ensuring everyone can hear the alarm.

Figure 14:
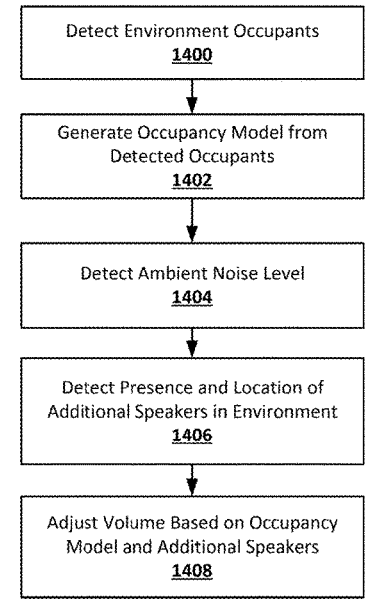
FIG. 14 shows an example of a process suitable for dynamic volume adjustment according to an implementation of the disclosed subject matter.

FIG. 14 shows an example of a process suitable for dynamic volume adjustment according to an implementation of the disclosed subject matter. At 1400, occupants of the environment may be detected. For example, an alarm, such as a hazard alarm, may have been triggered. This may trigger the proximity sensor 110 to scan a room, such as the room 700, and detect the distance occupants of the room, such as the persons 910, 920, and 930. The proximity sensor 110 may be, for example, an active infrared sensor, and may determine the presence of and distance to any occupants in the room. Other sensors in the smart home environment, such as the sensor devices 510, may also be triggered to detect the presence and location of any occupants throughout the environment. For example, the sensor 1022 may detect the presence and location of any occupants in the room 1020.

At 1402, an occupancy model may be generated from the detected occupants. For example, the occupancy detector 170 may receive data from the proximity sensor 110 and sensor devices 510 regarding occupants detected in the room and throughout the environment and their distances and angles relative to the proximity sensor 110, other sensor devices 510, or other positioning data. The occupancy detector 170 may generate an occupancy model 142 for the environment, which may locate the occupants of the environment in the various rooms and other areas of the environment.

At 1404, an ambient noise level may be detected. For example, a microphone located within the same room or area as the speaker 130 may detect any ambient noise, and may determine the sound level of the ambient noise.

At 1406, the presence and location of additional speakers in the environment may be detected. For example, the hub computing device 100 may include the speaker 130. The hub computing device 100 may detect, for example, through querying of available devices, or a list of available devices, the presence of additional speakers located through the environment and connected to the smart home environment, for example, through other hub computing devices or as part of other devices within the smart home environment.

At 1408, the volume of the speaker may be adjusted based on the occupancy model and the additional speakers. For example, the dynamic volume adjuster 150 may determine, based on the occupancy model 142 and the location of additional speakers in the environment, that the speaker 130 is the closest speaker to an occupant, for example, the person 1024 in the room 1020. The dynamic volume adjuster 150 may generate a volume adjustment that may raise the volume of the speaker 130 to a level that may allow the person 1024 to hear an alarm sounding over the speaker 130. The volume adjustment may be determined based on the location of the person 1024 relative to the speaker 130, and any objects, for example, as represented in the room model 141, which may interfere with sound traveling from the speaker 130 to the location of the person 1024. For example, if the person 1024 is located behind a wall from the speaker 130, the volume adjustment may be raise the volume higher as opposed to if the person 1024 was standing near an open entryway that had a line of sight to the speaker 130. The dynamic volume adjuster 150 may also account for the local ambient noise level when generating the volume adjustment for the speaker 130.

Multiple hub computing devices and speakers of a smart home environment may use the occupancy model 142 for the environment to determine which speakers are the closest to the various occupants detected throughout the environment. This may result in volume adjustments to the speakers so that every occupant of the environment may hear an alarm or alert from the smart home environment over the most suitable speaker, which may be the speaker nearest to the occupant, even when the occupant is in a room or area that does not have its own speaker. In some instances, instead of using the closest speaker to an occupant, a farther away speaker may be more optimal, as the closest speaker may need to be set a volume level lower than what would be needed to reach an occupant in another room due to the proximity of an occupant to closest speaker. For example, a first room may have a first speaker and a first occupant standing next to the speaker. A second room adjoining the first room may have a second occupant and no speaker. A third room adjoining the second room may have a second speaker and no occupant. The first speaker may be closer to the second occupant than the second speaker, but to reach the second occupant, the first speaker may need to be set to a sound level too high for the first occupant. In this case, it may be determined that the second speaker should have its volume adjusted to reach the second occupant, as this may result in more optimal sound levels despite the first speaker being closer to the second occupant.

Embodiments disclosed herein may use one or more sensors. In general, a "sensor" may refer to any device that can obtain information about its environment. Sensors may be described by the type of information they collect. For example, sensor types as disclosed herein may include motion, smoke, carbon monoxide, proximity, temperature, time, physical orientation, acceleration, location, and the like. A sensor also may be described in terms of the particular physical device that obtains the environmental information. For example, an accelerometer may obtain acceleration information, and thus may be used as a general motion sensor and/or an acceleration sensor. A sensor also may be described in terms of the specific hardware components used to implement the sensor. For example, a temperature sensor may include a thermistor, thermocouple, resistance temperature detector, integrated circuit temperature detector, or combinations thereof. In some cases, a sensor may operate as multiple sensor types sequentially or concurrently, such as where a temperature sensor is used to detect a change in temperature, as well as the presence of a person or animal.

In general, a "sensor" as disclosed herein may include multiple sensors or sub-sensors, such as where a position sensor includes both a global positioning sensor (GPS) as well as a wireless network sensor, which provides data that can be correlated with known wireless networks to obtain location information. Multiple sensors may be arranged in a single physical housing, such as where a single device includes movement, temperature, magnetic, and/or other sensors. Such a housing also may be referred to as a sensor or a sensor device. For clarity, sensors are described with respect to the particular functions they perform and/or the particular physical hardware used, when such specification is necessary for understanding of the embodiments disclosed herein.

Figure 15:
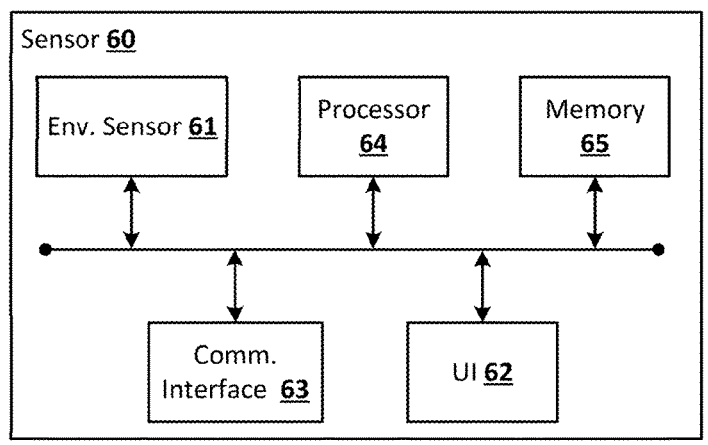
FIG. 15 shows a computing device according to an embodiment of the disclosed subject matter.

A sensor may include hardware in addition to the specific physical sensor that obtains information about the environment. FIG. 15 shows an example sensor as disclosed herein. The sensor 60 may include an environmental sensor 61, such as a temperature sensor, smoke sensor, carbon monoxide sensor, motion sensor, accelerometer, proximity sensor, passive infrared (PIR) sensor, magnetic field sensor, radio frequency (RF) sensor, light sensor, humidity sensor, or any other suitable environmental sensor, that obtains a corresponding type of information about the environment in which the sensor 60 is located. A processor 64 may receive and analyze data obtained by the sensor 61, control operation of other components of the sensor 60, and process communication between the sensor and other devices. The processor 64 may execute instructions stored on a computer-readable memory 65. The memory 65 or another memory in the sensor 60 may also store environmental data obtained by the sensor 61. A communication interface 63, such as a Wi-Fi or other wireless interface, Ethernet or other local network interface, or the like may allow for communication by the sensor 60 with other devices. A user interface (UI) 62 may provide information and/or receive input from a user of the sensor. The UI 62 may include, for example, a speaker to output an audible alarm when an event is detected by the sensor 60. Alternatively, or in addition, the UI 62 may include a light to be activated when an event is detected by the sensor 60. The user interface may be relatively minimal, such as a limited-output display, or it may be a full-featured interface such as a touchscreen. Components within the sensor 60 may transmit and receive information to and from one another via an internal bus or other mechanism as will be readily understood by one of skill in the art. One or more components may be implemented in a single physical arrangement, such as where multiple components are implemented on a single integrated circuit. Sensors as disclosed herein may include other components, and/or may not include all of the illustrative components shown.

Sensors as disclosed herein may operate within a communication network, such as a conventional wireless network, and/or a sensor-specific network through which sensors may communicate with one another and/or with dedicated other devices. In some configurations one or more sensors may provide information to one or more other sensors, to a central controller, or to any other device capable of communicating on a network with the one or more sensors. A central controller may be general- or special-purpose. For example, one type of central controller is a home automation network that collects and analyzes data from one or more sensors within the home. Another example of a central controller is a special-purpose controller that is dedicated to a subset of functions, such as a security controller that collects and analyzes sensor data primarily or exclusively as it relates to various security considerations for a location. A central controller may be located locally with respect to the sensors with which it communicates and from which it obtains sensor data, such as in the case where it is positioned within a home that includes a home automation and/or sensor network. Alternatively or in addition, a central controller as disclosed herein may be remote from the sensors, such as where the central controller is implemented as a cloud-based system that communicates with multiple sensors, which may be located at multiple locations and may be local or remote with respect to one another.

Figure 16:
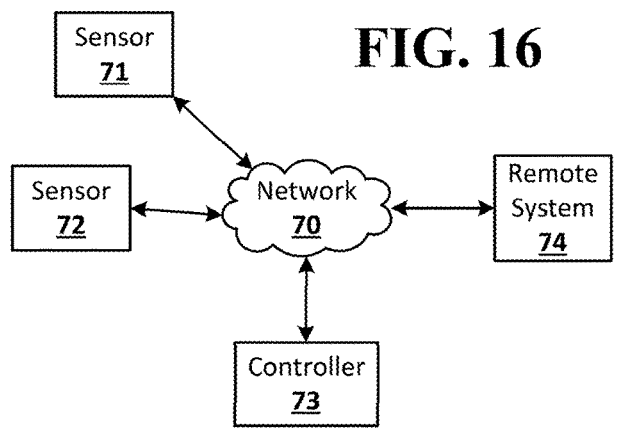
FIG. 16 shows a system according to an embodiment of the disclosed subject matter.

FIG. 16 shows an example of a sensor network as disclosed herein, which may be implemented over any suitable wired and/or wireless communication networks. One or more sensors 71, 72 may communicate via a local network 70, such as a Wi-Fi or other suitable network, with each other and/or with a controller 73. The controller may be a general- or special-purpose computer. The controller may, for example, receive, aggregate, and/or analyze environmental information received from the sensors 71, 72. The sensors 71, 72 and the controller 73 may be located locally to one another, such as within a single dwelling, office space, building, room, or the like, or they may be remote from each other, such as where the controller 73 is implemented in a remote system 74 such as a cloud-based reporting and/or analysis system. Alternatively or in addition, sensors may communicate directly with a remote system 74. The remote system 74 may, for example, aggregate data from multiple locations, provide instruction, software updates, and/or aggregated data to a controller 73 and/or sensors 71, 72.

For example, the hub computing device 100, proximity sensor 110, and the sensor devices 510, may be examples of a controller 73 and sensors 71 and 72, as shown and described in further detail with respect to FIGS. 1-14.

The devices of the security system and smart-home environment of the disclosed subject matter may be communicatively connected via the network 70, which may be a mesh-type network such as Thread, which provides network architecture and/or protocols for devices to communicate with one another. Typical home networks may have a single device point of communications. Such networks may be prone to failure, such that devices of the network cannot communicate with one another when the single device point does not operate normally. The mesh-type network of Thread, which may be used in the security system of the disclosed subject matter, may avoid communication using a single device. That is, in the mesh-type network, such as network 70, there is no single point of communication that may fail so as to prohibit devices coupled to the network from communicating with one another.

The communication and network protocols used by the devices communicatively coupled to the network 70 may provide secure communications, minimize the amount of power used (i.e., be power efficient), and support a wide variety of devices and/or products in a home, such as appliances, access control, climate control, energy management, lighting, safety, and security. For example, the protocols supported by the network and the devices connected thereto may have an open protocol which may carry IPv6 natively.

The Thread network, such as network 70, may be easy to set up and secure to use. The network 70 may use an authentication scheme, AES (Advanced Encryption Standard) encryption, or the like to reduce and/or minimize security holes that exist in other wireless protocols. The Thread network may be scalable to connect devices (e.g., 2, 5, 10, 20, 50, 100, 150, 200, or more devices) into a single network supporting multiple hops (e.g., so as to provide communications between devices when one or more nodes of the network is not operating normally). The network 70, which may be a Thread network, may provide security at the network and application layers. One or more devices communicatively coupled to the network 70 (e.g., controller 73, remote system 74, and the like) may store product install codes to ensure only authorized devices can join the network 70. One or more operations and communications of network 70 may use cryptography, such as public-key cryptography.

The devices communicatively coupled to the network 70 of the smart-home environment and/or security system disclosed herein may low power consumption and/or reduced power consumption. That is, devices efficiently communicate to with one another and operate to provide functionality to the user, where the devices may have reduced battery size and increased battery lifetimes over conventional devices. The devices may include sleep modes to increase battery life and reduce power requirements. For example, communications between devices coupled to the network 70 may use the power-efficient IEEE 802.15.4 MAC/PHY protocol. In embodiments of the disclosed subject matter, short messaging between devices on the network 70 may conserve bandwidth and power. The routing protocol of the network 70 may reduce network overhead and latency. The communication interfaces of the devices coupled to the smart-home environment may include wireless system-on-chips to support the low-power, secure, stable, and/or scalable communications network 70.

The sensor network shown in FIG. 16 may be an example of a smart-home environment. The depicted smart-home environment may include a structure, a house, office building, garage, mobile home, or the like. The devices of the smart home environment, such as the sensors 71, 72, the controller 73, and the network 70 may be integrated into a smart-home environment that does not include an entire structure, such as an apartment, condominium, or office space.

The smart home environment can control and/or be coupled to devices outside of the structure. For example, one or more of the sensors 71, 72 may be located outside the structure, for example, at one or more distances from the structure (e.g., sensors 71, 72 may be disposed outside the structure, at points along a land perimeter on which the structure is located, and the like. One or more of the devices in the smart home environment need not physically be within the structure. For example, the controller 73 which may receive input from the sensors 71, 72 may be located outside of the structure.

The structure of the smart-home environment may include a plurality of rooms, separated at least partly from each other via walls. The walls can include interior walls or exterior walls. Each room can further include a floor and a ceiling. Devices of the smart-home environment, such as the sensors 71, 72, may be mounted on, integrated with and/or supported by a wall, floor, or ceiling of the structure.

The smart-home environment including the sensor network shown in FIG. 16 may include a plurality of devices, including intelligent, multi-sensing, network-connected devices that can integrate seamlessly with each other and/or with a central server or a cloud-computing system (e.g., controller 73 and/or remote system 74) to provide home-security and smart-home features. The smart-home environment may include one or more intelligent, multi-sensing, network-connected thermostats (e.g., "smart thermostats"), one or more intelligent, network-connected, multi-sensing hazard detection units (e.g., "smart hazard detectors"), and one or more intelligent, multi-sensing, network-connected entryway interface devices (e.g., "smart doorbells"). The smart hazard detectors, smart thermostats, and smart doorbells may be the sensors 71, 72 shown in FIG. 16.

According to embodiments of the disclosed subject matter, the smart thermostat may detect ambient climate characteristics (e.g., temperature and/or humidity) and may control an HVAC (heating, ventilating, and air conditioning) system accordingly of the structure. For example, the ambient client characteristics may be detected by sensors 71, 72 shown in FIG. 16, and the controller 73 may control the HVAC system (not shown) of the structure.

A smart hazard detector may detect the presence of a hazardous substance or a substance indicative of a hazardous substance (e.g., smoke, fire, or carbon monoxide). For example, smoke, fire, and/or carbon monoxide may be detected by sensors 71, 72 shown in FIG. 16, and the controller 73 may control an alarm system to provide a visual and/or audible alarm to the user of the smart-home environment.

A smart doorbell may control doorbell functionality, detect a person's approach to or departure from a location (e.g., an outer door to the structure), and announce a person's approach or departure from the structure via audible and/or visual message that is output by a speaker and/or a display coupled to, for example, the controller 73.

In some embodiments, the smart-home environment of the sensor network shown in FIG. 16 may include one or more intelligent, multi-sensing, network-connected wall switches (e.g., "smart wall switches"), one or more intelligent, multi-sensing, network-connected wall plug interfaces (e.g., "smart wall plugs"). The smart wall switches and/or smart wall plugs may be the sensors 71, 72 shown in FIG. 16. The smart wall switches may detect ambient lighting conditions, and control a power and/or dim state of one or more lights. For example, the sensors 71, 72, may detect the ambient lighting conditions, and the controller 73 may control the power to one or more lights (not shown) in the smart-home environment. The smart wall switches may also control a power state or speed of a fan, such as a ceiling fan. For example, sensors 72, 72 may detect the power and/or speed of a fan, and the controller 73 may adjusting the power and/or speed of the fan, accordingly. The smart wall plugs may control supply of power to one or more wall plugs (e.g., such that power is not supplied to the plug if nobody is detected to be within the smart-home environment). For example, one of the smart wall plugs may controls supply of power to a lamp (not shown).

In embodiments of the disclosed subject matter, the smart-home environment may include one or more intelligent, multi-sensing, network-connected entry detectors (e.g., "smart entry detectors"). The sensors 71, 72 shown in FIG. 16 may be the smart entry detectors. The illustrated smart entry detectors (e.g., sensors 71, 72) may be disposed at one or more windows, doors, and other entry points of the smart-home environment for detecting when a window, door, or other entry point is opened, broken, breached, and/or compromised. The smart entry detectors may generate a corresponding signal to be provided to the controller 73 and/or the remote system 74 when a window or door is opened, closed, breached, and/or compromised. In some embodiments of the disclosed subject matter, the alarm system, which may be included with controller 73 and/or coupled to the network 70 may not arm unless all smart entry detectors (e.g., sensors 71, 72) indicate that all doors, windows, entryways, and the like are closed and/or that all smart entry detectors are armed.

The smart-home environment of the sensor network shown in FIG. 16 can include one or more intelligent, multi-sensing, network-connected doorknobs (e.g., "smart doorknob"). For example, the sensors 71, 72 may be coupled to a doorknob of a door (e.g., doorknobs 122 located on external doors of the structure of the smart-home environment). However, it should be appreciated that smart doorknobs can be provided on external and/or internal doors of the smart-home environment.

The smart thermostats, the smart hazard detectors, the smart doorbells, the smart wall switches, the smart wall plugs, the smart entry detectors, the smart doorknobs, the keypads, and other devices of the smart-home environment (e.g., as illustrated as sensors 71, 72 of FIG. 16 can be communicatively coupled to each other via the network 70, and to the controller 73 and/or remote system 74 to provide security, safety, and/or comfort for the smart home environment).

A user can interact with one or more of the network-connected smart devices (e.g., via the network 70). For example, a user can communicate with one or more of the network-connected smart devices using a computer (e.g., a desktop computer, laptop computer, tablet, or the like) or other portable electronic device (e.g., a smartphone, a tablet, a key FOB, and the like). A webpage or application can be configured to receive communications from the user and control the one or more of the network-connected smart devices based on the communications and/or to present information about the device's operation to the user. For example, the user can view can arm or disarm the security system of the home.

One or more users can control one or more of the network-connected smart devices in the smart-home environment using a network-connected computer or portable electronic device. In some examples, some or all of the users (e.g., individuals who live in the home) can register their mobile device and/or key FOBs with the smart-home environment (e.g., with the controller 73). Such registration can be made at a central server (e.g., the controller 73 and/or the remote system 74) to authenticate the user and/or the electronic device as being associated with the smart-home environment, and to provide permission to the user to use the electronic device to control the network-connected smart devices and the security system of the smart-home environment. A user can use their registered electronic device to remotely control the network-connected smart devices and security system of the smart-home environment, such as when the occupant is at work or on vacation. The user may also use their registered electronic device to control the network-connected smart devices when the user is located inside the smart-home environment.

Alternatively, or in addition to registering electronic devices, the smart-home environment may make inferences about which individuals live in the home and are therefore users and which electronic devices are associated with those individuals. As such, the smart-home environment "learns" who is a user (e.g., an authorized user) and permits the electronic devices associated with those individuals to control the network-connected smart devices of the smart-home environment (e.g., devices communicatively coupled to the network 70). Various types of notices and other information may be provided to users via messages sent to one or more user electronic devices. For example, the messages can be sent via email, short message service (SMS), multimedia messaging service (MMS), unstructured supplementary service data (USSD), as well as any other type of messaging services and/or communication protocols.

The smart-home environment may include communication with devices outside of the smart-home environment but within a proximate geographical range of the home. For example, the smart-home environment may include an outdoor lighting system (not shown) that communicates information through the communication network 70 or directly to a central server or cloud-computing system (e.g., controller 73 and/or remote system 74) regarding detected movement and/or presence of people, animals, and any other objects and receives back commands for controlling the lighting accordingly.

The controller 73 and/or remote system 74 can control the outdoor lighting system based on information received from the other network-connected smart devices in the smart-home environment. For example, in the event, any of the network-connected smart devices, such as smart wall plugs located outdoors, detect movement at night time, the controller 73 and/or remote system 74 can activate the outdoor lighting system and/or other lights in the smart-home environment.

Figure 17:
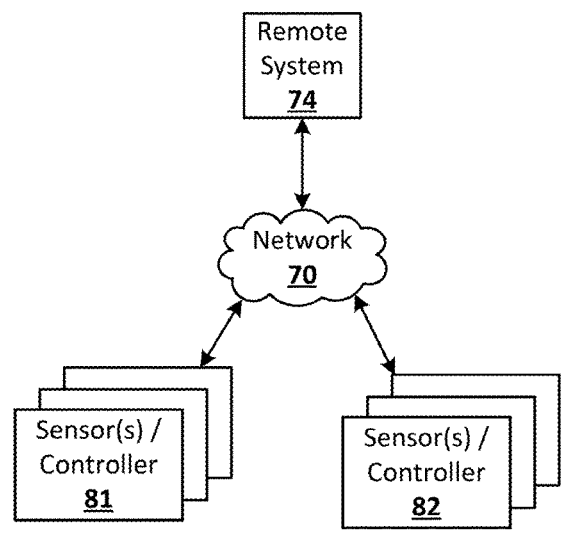
FIG. 17 shows a system according to an embodiment of the disclosed subject matter.

In some configurations, a remote system 74 may aggregate data from multiple locations, such as multiple buildings, multi-resident buildings, individual residences within a neighborhood, multiple neighborhoods, and the like. In general, multiple sensor/controller systems 81, 82 as previously described with respect to FIG. 17 may provide information to the remote system 74. The systems 81, 82 may provide data directly from one or more sensors as previously described, or the data may be aggregated and/or analyzed by local controllers such as the controller 73, which then communicates with the remote system 74. The remote system may aggregate and analyze the data from multiple locations, and may provide aggregate results to each location. For example, the remote system 74 may examine larger regions for common sensor data or trends in sensor data, and provide information on the identified commonality or environmental data trends to each local system 81, 82.

In situations in which the systems discussed here collect personal information about users, or may make use of personal information, the users may be provided with an opportunity to control whether programs or features collect user information (e.g., information about a user's social network, social actions or activities, profession, a user's preferences, or a user's current location), or to control whether and/or how to receive content from the content server that may be more relevant to the user. In addition, certain data may be treated in one or more ways before it is stored or used, so that personally identifiable information is removed. Thus, the user may have control over how information is collected about the user and used by a system as disclosed herein.

Figure 18:
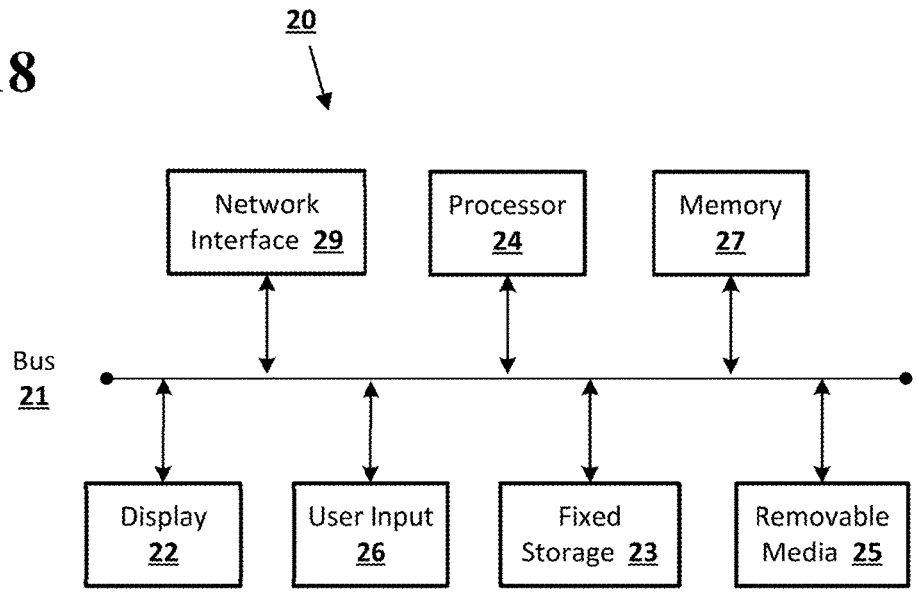
FIG. 18 shows a computer according to an embodiment of the disclosed subject matter.

Embodiments of the presently disclosed subject matter may be implemented in and used with a variety of computing devices. FIG. 18 is an example computing device 20 suitable for implementing embodiments of the presently disclosed subject matter. For example, the device 20 may be used to implement a controller, a device including sensors as disclosed herein, or the like. Alternatively or in addition, the device 20 may be, for example, a desktop or laptop computer, or a mobile computing device such as a smart phone, tablet, or the like. The device 20 may include a bus 21 which interconnects major components of the computer 20, such as a central processor 24, a memory 27 such as Random Access Memory (RAM), Read Only Memory (ROM), flash RAM, or the like, a user display 22 such as a display screen, a user input interface 26, which may include one or more controllers and associated user input devices such as a keyboard, mouse, touch screen, and the like, a fixed storage 23 such as a hard drive, flash storage, and the like, a removable media component 25 operative to control and receive an optical disk, flash drive, and the like, and a network interface 29 operable to communicate with one or more remote devices via a suitable network connection.

The bus 21 allows data communication between the central processor 24 and one or more memory components 25, 27, which may include RAM, ROM, and other memory, as previously noted. Applications resident with the computer 20 are generally stored on and accessed via a computer readable storage medium.

The fixed storage 23 may be integral with the computer 20 or may be separate and accessed through other interfaces. The network interface 29 may provide a direct connection to a remote server via a wired or wireless connection. The network interface 29 may provide such connection using any suitable technique and protocol as will be readily understood by one of skill in the art, including digital cellular telephone, WiFi, Bluetooth®, near-field, and the like. For example, the network interface 29 may allow the device to communicate with other computers via one or more local, wide-area, or other communication networks, as described in further detail herein.

Figure 19:
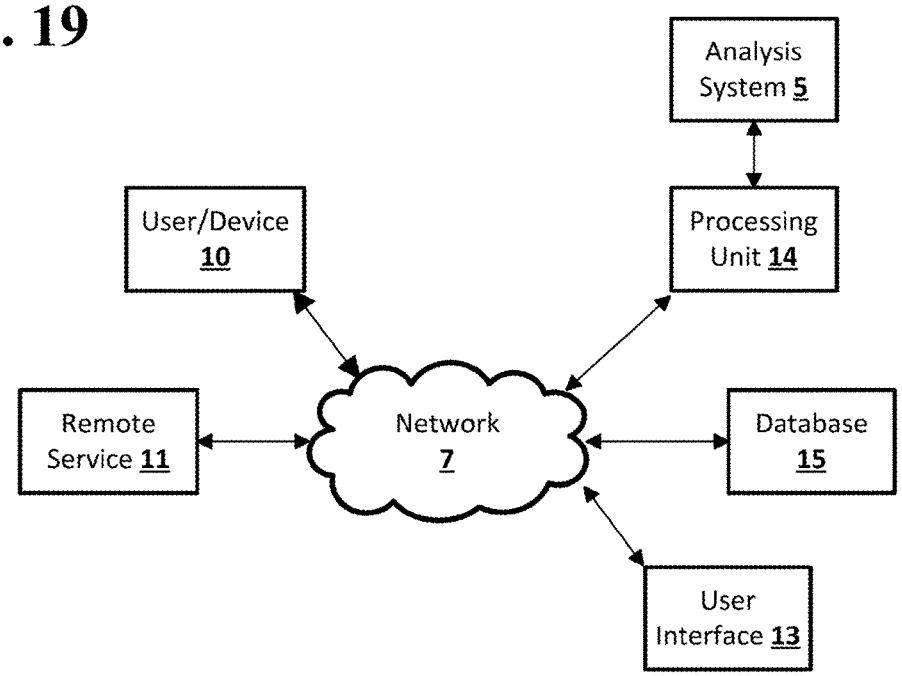
FIG. 19 shows a network configuration according to an embodiment of the disclosed subject matter.

FIG. 19 shows an example network arrangement according to an embodiment of the disclosed subject matter. One or more devices 10, 11, such as local computers, smart phones, tablet computing devices, and the like may connect to other devices via one or more networks 7. Each device may be a computing device as previously described. The network may be a local network, wide-area network, the Internet, or any other suitable communication network or networks, and may be implemented on any suitable platform including wired and/or wireless networks. The devices may communicate with one or more remote devices, such as servers 13 and/or databases 15. The remote devices may be directly accessible by the devices 10, 11, or one or more other devices may provide intermediary access such as where a server 13 provides access to resources stored in a database 15. The devices 10, 11 also may access remote platforms 17 or services provided by remote platforms 17 such as cloud computing arrangements and services. The remote platform 17 may include one or more servers 13 and/or databases 15.

Various embodiments of the presently disclosed subject matter may include or be embodied in the form of computer-implemented processes and apparatuses for practicing those processes. Embodiments also may be embodied in the form of a computer program product having computer program code containing instructions embodied in non-transitory and/or tangible media, such as hard drives, USB (universal serial bus) drives, or any other machine readable storage medium, such that when the computer program code is loaded into and executed by a computer, the computer becomes an apparatus for practicing embodiments of the disclosed subject matter. When implemented on a general-purpose microprocessor, the computer program code may configure the microprocessor to become a special-purpose device, such as by creation of specific logic circuits as specified by the instructions.

Embodiments may be implemented using hardware that may include a processor, such as a general purpose microprocessor and/or an Application Specific Integrated Circuit (ASIC) that embodies all or part of the techniques according to embodiments of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to embodiments of the disclosed subject matter.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A computer-implemented method performed by a data processing apparatus, the method comprising:
receiving a signal comprising a detected distance to a person from a proximity sensor of a smart home environment;
generating a first volume adjustment for a speaker of the smart home environment based on the detected distance to the person and a sound level associated with the detected distance to the person;
adjusting the volume of the speaker based on the first volume adjustment;
determining from the detected distance to the person that the person is at a location within a range of an authentication device of the smart home environment that would allow the person to interact with the authentication device;
receiving a signal from the authentication device indicating that no interaction with the authentication device is detected;
generating a second volume adjustment for the speaker based on a sound level that is higher than a current sound level of the speaker at the location of the person; and adjusting the volume of the speaker based on the second volume adjustment.

2. The computer-implemented method of claim 1, further comprising:
receiving a signal from a sensor of the smart home environment indicating that the sensor has been tripped;
triggering the proximity sensor, based on the received signal indicating the sensor has been tripped, to detect a distance to the person to generate the detected distance; and
sounding an alarm through the speaker.

3. The computer-implemented method of claim 1, further comprising:
receiving a signal from the authentication device indicating that interaction with the authentication device is detected;
generating a third volume adjustment for the speaker based on a sound level that is lower than a current sound level of the speaker at the location of the person; and
adjusting the volume of the speaker based on the third volume adjustment.

4. The computer-implemented method of claim 1, further comprising:
receiving a signal from the authentication device indicating that a failure of an interaction with the authentication device is detected;
generating a third volume adjustment for the speaker based on a sound level that is higher than a current sound level of the speaker at the location of the person; and
adjusting the volume of the speaker based on the third volume adjustment.

5. The computer-implemented method of claim 1, wherein the authentication device is a device for receiving input from a person to disarm a security system of the smart home environment.

6. The computer-implemented method of claim 4, wherein the failure of an interaction is detected when a person has failed to disarm a security system of the smart home environment by interacting with the authentication device.

7. The computer-implemented method of claim 1, wherein the authentication device is a keypad.

8. The computer-implemented method of claim 1, wherein a hub computing device of the smart home environment comprises the speaker and the proximity sensor.

9. The computer-implemented method of claim 1, wherein the sound level is associated with the detected distance to the person by a monotonic function.

10. The computer-implemented method of claim 1, wherein the proximity sensor is an active infrared sensor.

11. The computer-implemented method of claim 1, further comprising:
receiving signals from the proximity sensor comprising distances to objects visible to the proximity sensor in a room, wherein at least one the objects is a wall of the room;
generating a room model for the room from the signals received from the proximity sensor, wherein the room model comprises the dimensions of the room; and
determining, from the room model, a volume adjustment for a default volume of the speaker based on preset default volume of the speaker and the dimensions of a generic room used to determine the preset default volume of the speaker.

12. The computer-implemented method of claim 11, wherein the room model is a 2-dimensional map of the room.

13. A computer-implemented system for dynamic volume adjustment comprising:
a proximity sensor of a smart home environment adapted to detect a distance to a person and generate a signal comprising the detected distance to the person;
a speaker of the smart home environment adapted to play back audio;
a hub computing device of the smart home environment adapted to receive the signal comprising the detected distance to the person, generate a first volume adjustment for the speaker based on the detected distance to the person and a sound level associated with the detected distance to the person, adjust the volume of the speaker based on the first volume adjustment, determine from the detected distance to the person that the person is at a location within a range of an authentication device of the smart home environment that would allow the person to interact with the authentication device, receive a signal from the authentication device indicating that no interaction with the authentication device is detected, generate a second volume adjustment for the speaker based on a sound level that is higher than a current sound level of the speaker at the location of the person, and adjust the volume of the speaker based on the second volume adjustment.

14. The computer-implemented system of claim 13, wherein the hub computing device is further adapted to receive a signal from a sensor of the smart home environment indicating that the sensor has been tripped, trigger the proximity sensor, based on the received signal indicating the sensor has been tripped, to detect a distance to the person to generate the detected distance, and sound an alarm through the speaker.

15. The computer-implemented system of claim 13, wherein the authentication device is further adapted to generate a signal indicating that interaction is detected, and wherein the hub computing device is further adapted to receive the signal from the authentication device indicating that interaction with the authentication device is detected, generate a third volume adjustment for the speaker based on a sound level that is lower than a current sound level of the speaker at the location of the person, and adjust the volume of the speaker based on the third volume adjustment.

16. The computer-implemented system of claim 13, wherein the authentication device is further adapted to generate a signal indicating that a failure of an interaction is detected, and wherein the hub computing device is further adapted to receive the signal from the authentication device indicating that a failure of an interaction with the authentication device is detected, generate a third volume adjustment for the speaker based on a sound level that is higher than a current sound level of the speaker at the location of the person, and adjust the volume of the speaker based on the third volume adjustment.

17. The computer-implemented system of claim 13, wherein the proximity sensor is an active infrared sensor.

18. The computer-implemented system of claim 13, wherein the hub computing device comprises the proximity sensor and the speaker.

19. The computer-implemented system of claim 13, wherein the authentication device comprises a keypad, a touchscreen display, a fingerprint scanner, a retinal scanner, a camera, a microphone, or a WiFi, Bluetooth, RF, or NFC device.

20. A system comprising: one or more computers and one or more storage devices storing instructions which are operable, when executed by the one or more computers, to cause the one or more computers to perform operations comprising:
- receiving a signal comprising a detected distance to a person from a proximity sensor of a smart home environment;
- generating a first volume adjustment for a speaker of the smart home environment based on the detected distance to the person and a sound level associated with the detected distance to the person;
- adjusting the volume of the speaker based on the first volume adjustment;
- determining from the detected distance to the person that the person is at a location within a range of an authentication device of the smart home environment that would allow the person to interact with the authentication device;
- receiving a signal from the authentication device indicating that no interaction with the authentication device is detected;
- generating a second volume adjustment for the speaker based on a sound level that is higher than a current sound level of the speaker at the location of the person; and
- adjusting the volume of the speaker based on the second volume adjustment.

21. The system of claim 20, wherein the instructions further cause the one or more computers to perform operations comprising:
- receiving a signal from a sensor of the smart home environment indicating that the sensor has been tripped;
- triggering the proximity sensor, based on the received signal indicating the sensor has been tripped, to detect a distance to the person to generate the detected distance; and
- sounding an alarm through the speaker.

22. The system of claim 20, wherein the instructions further cause the one or more computers to perform operations comprising:
- receiving a signal from the authentication device indicating that interaction with the authentication device is detected;
- generating a third volume adjustment for the speaker based on a sound level that is lower than a current sound level of the speaker at the location of the person; and
- adjusting the volume of the speaker based on the third volume adjustment.

23. The system of claim 20, wherein the instructions further cause the one or more computers to perform operations comprising:
- receiving a signal from the authentication device indicating that a failure of an interaction with the authentication device is detected;
- generating a third volume adjustment for the speaker based on a sound level that is higher than a current sound level of the speaker at the location of the person; and
- adjusting the volume of the speaker based on the third volume adjustment.

* * * * *